United States Patent
Roberts et al.

(10) Patent No.: US 9,634,251 B2
(45) Date of Patent: Apr. 25, 2017

(54) NANOTUBE SOLUTION TREATED WITH MOLECULAR ADDITIVE, NANOTUBE FILM HAVING ENHANCED ADHESION PROPERTY, AND METHODS FOR FORMING THE NANOTUBE SOLUTION AND THE NANOTUBE FILM

(75) Inventors: David A. Roberts, Woburn, MA (US); Rahul Sen, Lexington, MA (US); Peter Sites, Marblehead, MA (US); J. Thomas Kocab, Exeter, RI (US); Billy Smith, Woburn, MA (US); Feng Gu, Ellicott City, MD (US)

(73) Assignee: Nantero Inc., Woburn, MA (US)

(*) Notice: Subject to any disclaimer, the term of this patent is extended or adjusted under 35 U.S.C. 154(b) by 0 days.

(21) Appl. No.: 13/416,820

(22) Filed: Mar. 9, 2012

(65) Prior Publication Data
US 2013/0224934 A1 Aug. 29, 2013

Related U.S. Application Data

(60) Provisional application No. 61/603,850, filed on Feb. 27, 2012.

(51) Int. Cl.
*H01B 1/04* (2006.01)
*B82Y 40/00* (2011.01)
(Continued)

(52) U.S. Cl.
CPC .......... *H01L 51/0003* (2013.01); *B82Y 10/00* (2013.01); *B82Y 30/00* (2013.01);
(Continued)

(58) Field of Classification Search
CPC .......................... H01B 1/02–1/04; H01B 1/22
(Continued)

(56) References Cited

U.S. PATENT DOCUMENTS 6,187,823 B1   2/2001  Haddon et al.
6,331,262 B1  12/2001  Haddon et al.
(Continued)

FOREIGN PATENT DOCUMENTS

EP   0947466   6/1999
EP   1061040  12/2000
(Continued)

OTHER PUBLICATIONS

Yan et al. ("Synthesis and characterization of nano/microstructured crystalline germanium dioxide with novel morphology." Chinese Sc Bull, 54, pp. 2810-2813, 2009).*
(Continued)

*Primary Examiner* — Tri V Nguyen
(74) *Attorney, Agent, or Firm* — Nantero Inc.

(57) ABSTRACT

The present disclosure provides a nanotube solution being treated with a molecular additive, a nanotube film having enhanced adhesion property due to the treatment of the molecular additive, and methods for forming the nanotube solution and the nanotube film. The nanotube solution includes a liquid medium, nanotubes in the liquid medium, and a molecular additive in the liquid medium, wherein the molecular additive includes molecules that provide source elements for forming a group IV oxide within the nanotube solution. The molecular additive can introduce silicon (Si) and/or germanium (Ge) in the liquid medium, such that nominal silicon and/or germanium concentrations of the nanotube solution ranges from about 5 ppm to about 60 ppm.

22 Claims, 18 Drawing Sheets

(51) Int. Cl.
*H01L 51/00* (2006.01)
*B82Y 30/00* (2011.01)
*C01B 31/02* (2006.01)
*B82Y 10/00* (2011.01)
*H01L 21/02* (2006.01)

(52) U.S. Cl.
CPC ............ *B82Y 40/00* (2013.01); *C01B 31/026* (2013.01); *H01L 21/02532* (2013.01); *H01L 21/02606* (2013.01); *H01L 21/02628* (2013.01); *H01L 51/0048* (2013.01)

(58) Field of Classification Search
USPC ........... 252/500–518.1, 521.3; 977/742, 811, 977/815
See application file for complete search history.

(56) References Cited

U.S. PATENT DOCUMENTS

| | | |
|---|---|---|
| 6,368,569 B1 | 4/2002 | Haddon et al. |
| 6,531,513 B2 | 3/2003 | Haddon et al. |
| 6,641,793 B2 | 11/2003 | Haddon et al. |
| 6,752,977 B2 | 6/2004 | Smalley et al. |
| 6,835,591 B2 | 12/2004 | Rueckes et al. |
| 6,896,864 B2 | 5/2005 | Clarke |
| 6,921,575 B2 | 7/2005 | Horiuchi et al. |
| 6,924,538 B2 | 8/2005 | Jaiprakash et al. |
| 7,115,864 B2 | 10/2006 | Colbert et al. |
| 7,259,410 B2 | 8/2007 | Jaiprakash et al. |
| 7,335,395 B2 | 2/2008 | Ward et al. |
| 7,365,532 B2 | 4/2008 | Hinck et al. |
| 7,375,369 B2 | 5/2008 | Sen et al. |
| 7,531,209 B2 * | 5/2009 | Ayers ............................ 427/230 |
| 7,666,382 B2 | 2/2010 | Ghenciu et al. |
| 7,833,504 B2 | 11/2010 | Wong et al. |
| 2002/0081380 A1 | 6/2002 | Dillon et al. |
| 2003/0065206 A1 | 4/2003 | Bolskar et al. |
| 2003/0102222 A1* | 6/2003 | Zhou et al. ................... 205/109 |
| 2003/0220518 A1 | 11/2003 | Bolskar et al. |
| 2004/0034177 A1 | 2/2004 | Chen |
| 2004/0254282 A1* | 12/2004 | Suzuki et al. ................ 524/430 |
| 2004/0265550 A1* | 12/2004 | Glatkowski et al. ......... 428/209 |
| 2005/0053525 A1 | 3/2005 | Segal et al. |
| 2005/0058797 A1 | 3/2005 | Sen et al. |
| 2005/0065741 A1 | 3/2005 | Segal et al. |
| 2005/0154086 A1* | 7/2005 | Yoneyama .................... 523/213 |
| 2005/0269554 A1 | 12/2005 | Sen et al. |
| 2006/0052509 A1 | 3/2006 | Saitoh |
| 2006/0124028 A1* | 6/2006 | Huang et al. .............. 106/31.92 |
| 2006/0204427 A1 | 9/2006 | Ghenciu et al. |
| 2008/0171193 A1* | 7/2008 | Yi et al. ....................... 428/327 |
| 2008/0299307 A1 | 12/2008 | Ward et al. |
| 2008/0302998 A1* | 12/2008 | Hong et al. ..................... 252/74 |
| 2009/0169870 A1* | 7/2009 | Zheng .......................... 428/332 |
| 2009/0285746 A1* | 11/2009 | Kajiura et al. ............. 423/447.2 |
| 2010/0047569 A1* | 2/2010 | Peng et al. ................... 428/367 |
| 2010/0104854 A1* | 4/2010 | Takada et al. ................ 428/323 |
| 2010/0286327 A1* | 11/2010 | Moorlag et al. .............. 524/496 |
| 2010/0304101 A1* | 12/2010 | Lin et al. ...................... 428/212 |
| 2011/0025577 A1 | 2/2011 | Ward et al. |

FOREIGN PATENT DOCUMENTS

| | | | |
|---|---|---|---|
| JP | 2005314658 A * | 11/2005 | ................ C08F 2/44 |
| WO | WO-98/39250 | 9/1998 | |
| WO | WO-99/65821 | 12/1999 | |
| WO | WO-00/17101 | 3/2000 | |
| WO | WO-02/060812 | 8/2002 | |
| WO | WO-03/022733 | 3/2003 | |
| WO | WO-03/034142 | 4/2003 | |
| WO | WO-03/091486 | 11/2003 | |
| WO | WO-2004/039893 | 5/2004 | |
| WO | WO-2004/065655 | 8/2004 | |
| WO | WO-2004/065657 | 8/2004 | |
| WO | WO-2004/065671 | 8/2004 | |
| WO | WO-2006/078293 | 7/2006 | |
| WO | WO-2011/100661 | 8/2011 | |

OTHER PUBLICATIONS

Abe, et al., "Oligo- and polysiloxanes," Prog. Polym. Sci. xx (2004) xxx-xxx, pgs.
Ago, et al., "Workfunction of Purified and Oxidized Carbon Nanotubes," Synthetic Metals, vol. 103, 1999, pp. 2494-2495.
Ajayan, et al., "Applications of Carbon Nanotubes," Topics Appl. Phys., vol. 80, 2001, pp. 391-425.
Amblard, G., "Development and characterization of carbon nanotube processes for NRAM technology," Proc. of SPIE, 2011, vol. 7970, pp. 797017-1-797017-7.
Artyukhov, et al., "Theoretical Study of Two-Dimensional Silica Films," J. Phys. Chem. C, vol. 114, 2010, pp. 9678-9684.
Ausman, et al., Organic Solvent Dispersions of Single-Walled Carbon Nanotubes: Toward Solutions of Pristine Nanotubes, J. Phys. Chem. B, vol. 104, No. 38, Sep. 2000, pp. 8911-8915.
Bahr, et al., "Dissolution of Small Diameter Single-Wall Carbon Nanotubes in Organic Solvents," Chem. Commun., 2001, pp. 193-194.
Banerjee, "Functionalization of Carbon Nanotubes with a Metal-Containing Molecular Complex," Nano Letters, vol. 0, No. 0, 5 pages.
Berhan, "Mechanical Properties of Nanotube Sheets: Alterations in Joint Morphology and Achievable Moduli in Manufacturable Materials," Jrl. Appl. Phys., vol. 95, No. 8, Apr. 15, 2004, pp. 435-4345.
Brock, et al., "Carbon Nanotube Memories and Fabrics in a Radiation Hard Semiconductor Foundry," 2005 IEEE Conf. 9 pgs.
Cassell, "Large Scale CVD Synthesis of Single-Walled Carbon Nanotubes," J. Phys. Chem. B, vol. 103, 1999, pp. 6484-6492.
Chen, et al., "Dissolution of Full-Length Single-Walled Carbon Nanotubes," J. Phys. Chem. B, vol. 105, 2001, pp. 2525-2528.
Chen, et al., "Noncovalent Sidewall Functionalization of Single-Walled Carbon Nanotubes for Protein Immobilization," J. Am. Chem. Soc., vol. 123, 2001, pp. 3838-3839.
Chen, et al., "Solution Properties of Single-Walled Carbon Nanotubes," Science, vol. 282, Oct. 1998, pp. 95-98.
Chen, et al., "Heterogeneous Single-Walled Carbon Nanotube Catalyst Discovery and Optimization," Chem. Mater., vol. 14, 2002, pp. 1891-1896.
Cheng, "Large-Scale and Low-Cost Synthesis of Single-Walled Carbon Nanotubes by the Catalytic Pyrolysis of Hydrocarbons," Appl. Phys. Ltrs., vol. 72, No. 25, Jun. 1998, pp. 3282-3284.
Chiang, "Purification and Characterization of Single-Wall Carbon Nanotubes (SWNTS) Obtained from the Gas Phase Decomposition of CO (HiPco Process)," J. Phys. Chem. B, vol. 105, 2001, pp. 1157-1161.
Chiang, et al., "Purification and Characterization of Single-Wall Carbon Nanotubes," J. Phys. Chem. B, vol. 105, 2001, pp. 1157-1161.
Colomer, et al., "Different Purification Methods of Carbon Nanotubes Produced by Catalytic Synthesis," Synthetic Metals, vol. 103, 1999, pp. 2482-2483.
Delzeit, "Multilayered Metal Catalysts for Controlling the Density of Single-Walled Carbon Nanotube Growth," Chem. Phys. Ltrs., vol. 348, 2001, pp. 368-374.
Demadis, et al., "Inhibition and Growth Control of Colloidal Silica: Designed Chemical Approaches," Materials Performance, Apr. 2004, pp. 38-42.
Desai, "Freestanding Carbon Nanotube Specimen Fabrication," Proceedings of 2005 5th IEEE Conference on Nanotechnology, Nagoya, Japan, Jul. 2005, 4 pgs.
Dillon, et al., "A Simple and Complete Purification of Single-Walled Carbon Nanotube Materials," Adv. Mater., vol. 11, No. 16, 1999, pp. 1354-1358.
Fedeyko, et al., "Spontaneous Formation of Silica Nanoparticles in Basic Solutions of Small Tetraalkylammonium Cations," J. Phys. Chem. B, vol. 108, 2004, pp. 12271-12275.

(56) References Cited

OTHER PUBLICATIONS

Georgakilas, et al., "Organic Functionalization of Carbon Nanotubes," J. Am. Chem., Soc., vol. 124, No. 5, 2002, pp. 760-761.
Gromov, "Purification of Carbon Nanotubes," Caramel Workshop, Jan. 23, 2002, 13 pgs.
Haddon, "Purification and Separation of Carbon Nanotubes," MRS Bulletin, Apr. 2004, pp. 252-259.
Hafner, "Catalytic Growth of Single-Wall Carbon Nanotubes from Metal Particles," Chem. Phys. Ltrs., vol. 296, 1998, pp. 195-202.
Hata, et al., "Water-Assisted Highly Efficient Synthesis of Impurity-Free Single-Walled Carbon Nanotubes," Science, vol. 306, Nov. 2004, pp. 1362-.
Hirsch, A., "Functionalization of Single-Walled Carbon Nanotubes," Angew. Chem. Int. Ed., vol. 41, No. 11, 2002, pp. 1853-1859.
Hou, et al., "Multi-Step Purification of Carbon Nanotubes," Carbon, vol. 40, 2002, pp. 81-85.
Islam, et al., "High Weight Fraction Surfactant Solubilization of Single-Wall Carbon Nanotubes in Water," Nano Letters, vol. 3, No. 2, 2003, pp. 269-273.
International Search Report, PCT/US05/18465 dated Aug. 21, 2006 (3 pages).
International Search Report, PCT/US05/18467 dated Oct. 1, 2007 (5 pages).
International Search Report, PCT/US05/18539 dated Sep. 18, 2006 (4 pages).
Jamison, et al., "Bridged Polygermsesquioxanes. Organically Modified Germanium Oxide Materials," Chem. of Materials, vol. 5, No. 9, Sep. 1993, pgs.
Jeong, "A New Purification Method of Single-Wall Carbon Nanotubes using $H_2S$ and $O_2$ Mixture Gas," Chem. Phys. Ltrs., vol. 344, 2001, pp. 18-22.
Johnson, R. Colin, "IBM Grows Nanotube Patterns on Silicon Wafers," EE Times, Sep. 30, 2002, 1 page.
Kahn, et al., "Solubilization of Oxidized Single-Walled Carbon Nanotubes in Organic and Aqueous Solvents through Organic Derivatization," Nano Letters, vol. 2, No. 11, 2002, pp. 1215-1218.
Kianian, et al., "A 3D Stackable Carbon Nanotube-based Nonvolatile Memory (NRAM)," ESSDERC, Nantero, Inc., Jun. 14, 2010, 4 pgs.
Kong, et al., "Chemical Vapor Deposition of Methane for Single-Walled Carbon Nanotubes," Chemical Physics Ltrs., vol. 292, 1998, pp. 567-574.
Kong, et al., "Nanotube Molecular Wires as Chemical Sensors," Science, vol. 287, Jan. 28, 2000, pp. 622-625.
Liu, et al., "Self-Assembled Double Ladder Structure Formed Inside Carbon Nanotubes by Encapsulation of $H_8Si_8O_{12}$," ACS Nano, vol. 3, No. 5, 2009, pp. 1160-.
Martinez, et al., "Modifications of Single-Wall Carbon Nanotubes upon Oxidative Purification Treatments," http://www.iop.org/EJ/abstract/0957-4484/74/7/301 printed May 20, 2004.
Maruyama, et al., "Low-temperature synthesis of high-purity single-walled carbon nanotubes from alcohol," Chem. Phys. Ltrs., vol. 360, 2002, pp. 229-234.
Matarredona, et al., "Dispersion of Single-Walled Carbon Nanotubes in Aqueous Solutions of the Anionic Surfactant," J. Phys. Chem., vol. 107, 2003, pp. 11157-13367.
Mickelson, et al., "Solvation as Fluorinated Single-Wall Carbon Nanotubes in Alcohol Solvents," J. Phys. Chem. B, vol. 103, 1999, pp. 4318-4322.
Moore, et al., "Individually Suspended Single-Walled Carbon Nanotubes in Various Surfactants," Nano Letters, vol. 3, No. 10, 2003, pp. 1379-1382.
Multi-Disciplinair Project, "Wondrous World of Carbon Nanotubes," https/students.chem.tue.N1/ifp03/purification.html, Jun. 10, 2004.
Multifunctional Nanotube Composites, http://www.ornl.gov-odg/compositemain.html.printed May 20, 2004, pp. 1-5.
Murakami, et al., "Growth of vertically aligned single-walled carbon nanotube films on quartz substrates and their optical anisotropy," Chem. Phys. Ltrs., vol. 385, 2004, pp. 298-303.
Murphy, et al., "High-Yield, Nondestructive Purification and Quantification Method for Multiwalled Carbon Nanotubes," J. Phys., Chem. B, vol. 106, 2002, pp. 3087-3091.
Niyogi, et al., "Ultrasonic Dispersions of Single-Walled Carbon Nanotubes," J. Phys. Chem. B, vol. 107, 203, pp. 8799-8804.
O'Connell, et al., "Reversible Water-Solubilization of Single-Walled Carbon Nanotubes by Polymer Wrapping," Chem. Phys. Lett., vol. 342, 2001, pp. 265-271.
Onoa, et al., "Bulk Production of Singly Dispersed Carbon Nanotubes with Prescribed Lengths," Nanotechnology, vol. 16, 2005, pp. 2799-2803.
Parikh, et al., "Flexible Vapour Sensors Using Single Walled Carbon Nanotubes," Elsevier, Sensors and Actuators, B 113, 2006, pp. 55-63.
Peng, et al., "Composite Carbon Nanotube/Silica Fibers with Improved Mechanical Strengths and Electrical Conductivities," 2008 Wiley InterScience, vol. 4, No. 11, pp. 1964-1967.
Pompeo, et al., "Water Solubilization of Single-Walled Carbon Nanotubes by Functionalization with Glucosamine," Nano Letters, vol. 2, No. 4, 2002.
Riggs, et al., "Optical Limiting Properties of Suspended and Solubilized Carbon Nanotubes," J. Phys. Chem. B, vol. 104, 2000, pp. 7071-7076.
Riggs, et al, "Strong Luminescence of Solubilized Carbon Nanotubes," J. Am. Chem. Soc., vol. 122, 2000, pp. 5879-5880.
Rimer, et al., "Self-Assembly and Phase Behavior of Germanium Oxide Nanoparticles in Basic Aqueous Solutions," Langmuir, vol. 23, 2007, pp. 2784-2791.
Rinzler, "Large-Scale Purification of Single-Wall Carbon Nanotubes: Process, Product, and Characterization," Appl. Phys. A, vol. 67, 1998, pp. 29-37.
Rosendale, et al., "A 4 Megabit Carbon Nanotube-based Nonvolatile Memory (NRAM)," ESSCIRC, 2010 Proceedings, pp. 478-481.
Rueckes, et al, "Carbon Nanotube-Based Nonvolatile Random Access Memory for Molecular Computing," Science, 2000, vol. 289, pp. 94-97.
Shelimov, "Purification of Single-Walled Carbon Nanotubes by Ultrasonically Assisted Filtration," Chemical Physics Letters, vol. 282, Jan. 23, 1998, pp. 29-37.
Star, et al., "Preparation and Properties of Polymer-Wrapped Single-Walled Carbon Nanotubes," Angew. Chem. Int. Ed., vol. 40, No. 9, 2001, pp. 1721-1725.
Sun, et al., "High Dissolution and Strong Light Emission of Carbon Nanotubes in Aromatic Amine Solvents," J. Am. Chem. Soc., vol. 123, 2001, pp. 5348-5349.
Sun, et al., "Soluble Dendron-Functionalized Carbon Nanotubes: Preparation, Characterization, and Properties," Chem. Mater., vol. 13, 2001, pp. 2864-2869.
Vivekchand, et al., "A New Method of Preparing Single-Walled Carbon Nanotubes," Proc. Indian Acad., Sci. (Chem. Sci.) vol. 115, Nos. 5&6, Oct.-Dec. 2003, pp. 209-518.
Wang, et al., "Encapsulation and IR Probing of Cube-Shaped Octasilasesquioxane $H_8Si_8O_{12}$ in Carbon Nanotubes," Angew. Chem. Int. Ed. 2006, vol. 45, pp. 5188-5191.
Ward, et al., "A Non-Volatile Nanoelectromechanical Memory Element Utilizing a Fabric of Carbon Nanotubes" IEEE 2004, pp. 34-38.
Yadav, et al., Synthesis of multi-walled carbon nanotube/polyhedral oligomeric silsesquioxane nanohybrid by utilizing click chemistry, Nanoscale Research Letters, 6:122, 2011, 6 pages.
Zhang, et al., "Fabrication of mesoporous silica-coated CNTs and application in size-selective protein separation," J. Mater, Chem., vol. 20, 2010, pp. 5835-5842.
Zhang, et al., "Ultra-high-yield growth of vertical single-walled carbon nanotubes: Hidden roles of hydrogen and oxygen," PNAS, vol. 102, No. 45, Nov. 2005. pp. 16141-16145.
Zhu, et al., "Direct Synthesis of Long Single-Walled Carbon Nanotube Strands," Science, vol. 296, May 2002, pp. 884-.

\* cited by examiner

NANOTUBE SOLUTION TREATED WITH MOLECULAR ADDITIVE, NANOTUBE FILM HAVING ENHANCED ADHESION PROPERTY, AND METHODS FOR FORMING THE NANOTUBE SOLUTION AND THE NANOTUBE FILM

CROSS-REFERENCE TO RELATED APPLICATIONS

This application claims the benefit of priority under 35 U.S.C. §119 to provisional application No. 61/603,850, filed Feb. 27, 2012, the entire contents of which are incorporated herein by reference.

This application relates to the following U.S. patents, which are assigned to the assignee of this application, and are hereby incorporated by reference in their entirety:

Methods of Nanotube Films and Articles (U.S. Pat. No. 6,835,591), filed Apr. 23, 2002;

Methods of Using Pre-Formed Nanotubes to Make Carbon Nanotube Films, Layers, Fabrics, Ribbons, Elements, and Articles (U.S. Pat. No. 7,335,395), filed 10 Jan. 13, 2003;

Devices Having Horizontally-Disposed Nanofabric Articles and Methods of Making the Same (U.S. Pat. No. 7,259,410), filed Feb. 11, 2004;

Devices Having Vertically-Disposed Nanofabric Articles and Methods of Making Same (U.S. Pat. No. 6,924,538), filed Feb. 11, 2004;

Spin-Coatable Liquid for Formation of High Purity Nanotube Films (U.S. Pat. No. 7,375,369), filed Jun. 3, 2004;

Resistive Elements Using Carbon Nanotubes (U.S. Pat. No. 7,365,632), filed Sep. 20, 2005; and Aqueous Carbon Nanotube Applicator Liquids and Methods for Producing Applicator Liquids Thereof (U.S. Pat. No. 7,666,382), filed Dec. 15, 2005.

This application relates to the following patent applications, which are assigned to the assignee of this application, and are hereby incorporated by reference in their entirety:

Methods of Making Carbon Nanotube Films, Layers, Fabrics, Ribbons, Elements, and Articles (U.S. Patent Publication No. 2008/0299307), filed Jan. 13, 2003;

High Purity Nanotube Fabrics and Films (U.S. Patent Publication No. 2005/0058797), filed Jun. 3, 2004;

Anisotropic Nanotube Fabric Layers and Films and Methods of Forming Same (U.S. Patent Publication No. 2011/0025577), filed Jul. 31, 2009; and Methods for Controlling Density, Porosity, and/or Gap Size within Nanotube Fabric Layers and Films (PCT Patent Publication No. WO 2011/100661), filed Feb. 14, 2011.

BACKGROUND

Technical Field

The present disclosure relates to a nanotube solution, a nanotube film or fabric formed from the nanotube solution, and methods for forming the nanotube solution and the nanotube film or fabric. More particularly, the present disclosure relates to a nanotube solution being treated with a molecular additive, a nanotube film or fabric having enhanced adhesion property due to the treatment of the molecular additive, and methods for forming the nanotube solution and the nanotube film or fabric.

Related Art

Carbon nanotubes (CNTs) are useful for many applications. For example, engineers have been successful in using CNTs to build different semiconductor devices, such as memory devices and logic devices. In order to integrate CNT materials with existing semiconductor facilities, CNTs are normally dispersed in a solvent to form a CNT solution or dispersion.

Normally, solutions made from raw CNTs cannot be used in a semiconductor fabrication plant, because raw CNTs may contain undesirable impurities, such as amorphous carbon, metal, etc., which would negatively impact the electrical properties of the CNT film fabricated therefrom. Accordingly, raw CNTs have to be purified and/or processed before use.

Moreover, to fabricate semiconductor devices, many chemical and physical processes at the wafer scale are performed to define and etch device patterns. Accordingly, blanket films of CNTs must sustain such chemical and physical processes to ensure the quality of fabricated devices. To survive these processes and not to delaminate, the CNT films need to have good adhesion properties with respect to the substrate or any underlying layer. Accordingly, there is a need to develop a nanotube solution and a method of making the nanotube solution, such that a nanotube film of enhanced adhesion property can be formed on a semiconductor substrate.

SUMMARY

In one embodiment, the present disclosure provides a nanotube solution, including a liquid medium, nanotubes in the liquid medium, and a molecular additive in the liquid medium, wherein the molecular additive or additives includes molecules that provide the source elements for the formation of a group IV oxide, especially silicon, germanium, and/or their combination within the nanotube solution. Examples of silicon containing molecules comprise a silicon and oxygen containing cage molecule including at least eight silicon atoms. In one aspect, the molecular additive introduces silicon (Si) in the liquid medium, such that nominal silicon concentration of the nanotube solution ranges from about 5 ppm to about 60 ppm. In one aspect, the molecular additive comprises a silsesquioxane, and an especially effective silsesquioxane may be Octakis(tetramethylammonium)-T8-Silsequioxane, or PSS hydrate-Octakis(tetramethylammonium) substituted, hereinafter referred to as T8. Alternative sources of silicon that can similarly provide a soluble form of a silicate molecule can provide a similar benefit, providing that, in most if not all cases, the silicon concentration is maintained to avoid the saturation concentration of the silicates. Maintaining the silicon concentration to be below the saturation concentration, one may avoid colloidal precipitated particulates of the silicon oxides in a deposited nanotube film that exceed the molecular size regime, nominally greater than 0.5 to 3 nm and which are not visible with standard SEM or optical microscopy. These silicates are small relative to the 5 to 50 nm pores in the typical deposited nanotube fabric and hence provide for a more homogenous substrate surface for applications requiring very small size domains, i.e., ULSI electronic devices.

In another embodiment, the present disclosure provides a nanotube solution, including a liquid medium, nanotubes in the liquid medium, and a molecular additive in the liquid medium, wherein the molecular additive comprises a source of germanium for the formation of germanium oxides within the nanotube solution. Examples of germanium containing molecules comprise a cage molecule including at least eight germanium atoms. In one aspect, the molecular additive introduces germanium (Ge) in the liquid medium, such that nominal germanium concentration of the nanotube solution is selected to avoid a saturation concentration of the germanium oxide species resulting in restriction or elimination of colloidal precipitated particulates in the deposited nanotube film. Typically, molecular scale nanoparticles on the order of 0.5 to 3 nm are sustained in solutions wherein the concentration of germanium is less than a critical concentration wherein the formation of larger aggregate particulates begin to form. Examples of germanium containing molecules comprise addition of $GeO_2$ hydrate or $GeCl_4$, germanium tetrachloride, or germanium tetra-ethoxide. Under appropriate conditions, these are reported to hydrolyze and generate nanoparticulate germanium oxide clusters containing 8 germanium atoms.

In another embodiment, the present disclosure provides a nanotube solution, including a liquid medium, nanotubes in the liquid medium, and molecular additives in the liquid medium, wherein the molecular additives comprise a mixture of both the silicon and germanium sources in predetermined proportions and at concentrations that comprise a nanotube solution below the critical concentration of the group IV mixed oxide to restrict or avoid the formation of colloidal precipitated particulates in the deposited nanotube film.

In another embodiment, the present disclosure provides a method for forming a nanotube film having an enhanced adhesion property. The method includes coating one of the nanotube solution formulations described above on a substrate, and removing the solvent or suspension solution. In one aspect, the solvent or suspension solution is removed by decantation when the solvent or liquid vehicle is spun off or poured off of a deposited nanotube fabric. In another aspect, the solvent or liquid vehicle is removed in an evaporative process. Or, a combination of decantation and evaporation may be used as in a typical spin on process for coating silicon wafer and electronic device fabrication. In one aspect, the evaporative process includes baking the substrate in air at a temperature of about 300° C. In one aspect, the coating step and the evaporative process are repeated multiple times until the desired overall nanotube film thickness is achieved.

In still another embodiment, the present disclosure provides a method for forming a nanotube solution. The method includes dispersing nanotubes in a liquid medium to form an initial nanotube solution, purifying the initial nanotube to obtain a purified nanotube solution, and treating the purified nanotube solution with a molecular additive to obtain a treated nanotube solution, wherein the molecular additive comprises a Group IV oxide source molecule. In one aspect, treating the purified nanotube solution comprises adding a predetermined amount of the molecular additive in the purified nanotube solution so as to gain the benefits to adhesion and other properties of the carbon nanotube formulation while being below the critical concentration of the molecular additive to restrict or avoid the generation of colloidal particulates in the deposited nanotube film. In one aspect, the predetermined amount of the molecular additive corresponds to a silicon concentration of the treated nanotube solution that ranges from about 5 ppm to about 60 ppm for the T8 additive. In one aspect, treating the purified nanotube solution includes adding the molecular additive in the purified nanotube solution at room temperature. In another aspect, the solutions are specially treated to remove group IV elements (e.g., Si and Ge) prior to the Si and Ge additives to get better control over the group IV oxide composition.

DETAILED DESCRIPTIONS

Figure 1:
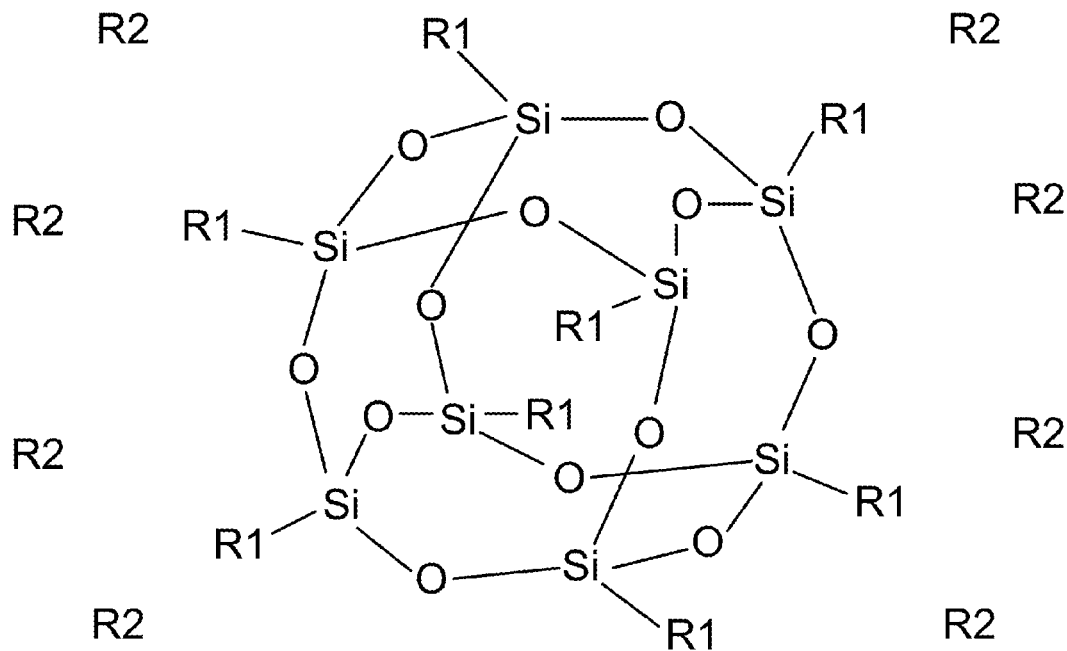
FIG. 1 illustrates the chemical structure of a molecular additive in accordance with one embodiment of the present disclosure.

The present disclosure teaches a nanotube application solution which, when deposited over a material layer via, for example, a spin coating process, forms a nanotube fabric layer (or film) which is highly adhesive. The nanotube fabric layer thus formed may resist from being decoupled from the underlying material layer. As discussed in detail below, using the methods of the present disclosure, a nanotube application solution is treated with one or more molecular additives in order to improve the adhesive properties of a nanotube fabric layer (or film) formed from such a solution.

For example, use of a spin coating process, commonly employed in the preparation of thin film materials for electronic applications, including nanotubes involves applying an excess of the solution containing the material to be deposited, generally in a solvent or liquid suspension vehicle to a spinning substrate, often a silicon wafer on a rotating platen. Rotation, typically at high speeds spreads the fluid by centrifugal acceleration. Spinning is continued while the liquid is spun off of the edge of the substrate leaving behind a thin uniform film of nanotubes, in our case. The vehicle or solvent is typically volatile and evaporates from the film, during the process or in combination with a post deposition evaporative procedure.

A fabric of nanotubes as referred to herein for the present disclosure includes a layer of multiple, interconnected carbon nanotubes. A fabric of nanotubes (or nanofabric), in the present disclosure, e.g., a non-woven carbon nanotube (CNT) fabric, may, for example, have a structure of multiple entangled nanotubes that are irregularly arranged relative to one another. Alternatively, or in addition, for example, the fabric of nanotubes for the present disclosure may possess some degree of positional regularity of the nanotubes, e.g., some degree of parallelism along their long axes. Such positional regularity may be found, for example, on a relatively small scale wherein flat arrays of nanotubes are arranged together along their long axes in rafts on the order of one nanotube long and ten to twenty nanotubes wide. In other examples, such positional regularity may be found on a larger scale, with regions of ordered nanotubes, in some cases, extended over substantially the entire fabric layer. Such larger scale positional regularity is of particular interest to the present disclosure.

The fabrics of nanotubes retain desirable physical properties of the nanotubes from which they are formed. For example, in some electrical applications, the fabric preferably has a sufficient amount of nanotubes in contact so that at least one ohmic (metallic) or semi-conductive pathway exists from a given point within the fabric to another point within the fabric. Single walled nanotubes may typically have a diameter of about 1-3 nm, and multi walled nanotubes may typically have a diameter of about 3-30 nm. Nanotubes may have lengths ranging from about 0.2 microns to about 200 microns, for example. The nanotubes may curve and occasionally cross one another. Gaps in the fabric, i.e., between nanotubes either laterally or vertically, may exist. Such fabrics may include single-walled nanotubes, multi-walled nanotubes, or both.

The fabric may have small areas of discontinuity with no tubes present. The fabric may be prepared as a layer or as multiple fabric layers, one formed over another. The thickness of the fabric can be chosen as thin as substantially a monolayer of nanotubes or can be chosen much thicker, e.g., tens of nanometers to hundreds of microns in thickness. The porosity of the fabrics can vary from low density fabrics with high porosity to high density fabrics with low porosity. Such fabrics can be prepared by growing nanotubes using chemical vapor deposition (CVD) processes in conjunction with various catalysts, for example.

Other methods for generating such fabrics may involve using spin-coating techniques and spray-coating techniques with preformed nanotubes suspended in a suitable solvent, silk screen printing, gravure printing, and electrostatic spray coating. Nanoparticles of other materials can be mixed with suspensions of nanotubes in such solvents and deposited by spin coating and spray coating to form fabrics with nanoparticles dispersed among the nanotubes.

As described within U.S. Pat. No. 7,375,369 to Sen et al. and U.S. Pat. No. 7,666,382 to Ghenciu et al., both incorporated herein by reference in their entirety, nanotube fabrics and films can be formed by applying a nanotube application solution (for example, but not limited to, a plurality of nanotube elements suspended within an aqueous solution) over a substrate element. A spin coating process, for example, can be used to evenly distribute the nanotube elements over the substrate element, creating a substantially uniform layer of nanotube elements. In other cases, other processes (such as, but not limited to, spray coating processes, dip coating processes, silk screen printing processes, and gravure printing processes) can be used to apply and distribute the nanotube elements over the substrate element. In other cases, CVD growth of nanotubes on a material surface may be used to realize an unordered nanotube fabric layer.

Further, PCT Application Publication No. WO 2011/100661 to Sen et al., incorporated herein by reference in its entirety, teaches methods of adjusting certain parameters (for example, the nanotube density or the concentrations of certain ionic species) within nanotube application solutions to either promote or discourage rafting—that is, the tendency for nanotube elements to group together along their sidewalls and form dense, raft-like structures—within a nanotube fabric layer formed with such a solution. By increasing the incidence of rafting within nanotube fabric layers, the density of such fabric layers can be increased, reducing both the number and size of voids and gaps within such fabric layers.

It should be noted that nanotube elements used and referenced within the embodiments of the present disclosure may be single-walled nanotubes, multi-walled nanotubes, or mixtures thereof and may be of varying lengths. Further, the nanotubes may be conductive, semiconductive, or combinations thereof. Further, the nanotubes may be functionalized (for example, by oxidation with nitric acid resulting in alcohol, aldehydic, ketonic, or carboxylic moieties attached to the nanotubes), or they may be non-functionalized.

It should be noted that the methods of the present disclosure are well suited for arranging functionalized nanotube elements within a nanotube fabric layer. Nanotube elements may be functionalized for a plurality of reasons. For example, certain moieties may be formed on the sidewalls of nanotube elements to add in the dispersion of those elements within an application solution. In another example, certain moieties formed on the sidewalls of nanotube elements can aid in the efficient formation of a nanotube fabric. In a further example, nanotube elements can be functionalized with certain moieties such as to electrically insulate the sidewalls of the nanotube elements. Nanotube elements can be functionalized by attaching organic, silica, or metallic moieties (or some combination thereof) to the sidewalls of the nanotube elements. Such moieties can interact with nanotube elements covalently or remain affixed through $\pi$-$\pi$ bonding.

Carbon nanotube (CNT) raw materials normally come in dry powder form. In order to integrate the manufacturing of nanotube devices with existing semiconductor facilities, it is often necessary to prepare a spin- or spray-coatable nanotube solution or dispersion before use. Accordingly, the nanotube powder has to be suspended, dispersed, solvated, or mixed in a liquid medium or solvent, so as to form a nanotube solution or dispersion. In some cases, this liquid medium could be water (including, but not limited to, distilled water or deionized water). In other cases, this liquid medium could be a non-aqueous solvent. The nanotube solution formed directly from CNT raw materials may be referred to as a "pristine" nanotube solution. In this disclosure, the term "nanotube solution," "nanotube suspension," and "nanotube dispersion" may be used interchangeably to refer to the same thing. The nanotube solution may be an aqueous or non-aqueous solution, and the solvent may be water or an organic/inorganic liquid. In one embodiment, the nanotube solution is an aqueous solution and the solvent is water.

To fabricate memory and/or logic devices in an industrial scale, there is a need to develop a CMOS-grade formulation of nanotube dispersions. The CMOS-grade formulation may require that the nanotube dispersions be of ultra-high purity, that is, substantially free from surfactants, trace metals, and/or other additives. In some cases, substantially free may refer to a concentration of less than or equal to 1 part-per-billion (ppb). Accordingly, extensive purification processes may be performed to the nanotube solution. In some embodiments, the purification processes may include one or more of a cross-flow filtration (CFF) process, a vacuum filtration process, sonication, centrifugation, treatments of certain chemicals, and/or any combinations thereof. Exemplary methods for purifying nanotube solutions have been disclosed in U.S. provisional application No. 61/384,610, entitled "Carbon Nanotube Solutions with Low Contamination and Methods for Purifying Carbon Nanotube Solutions," filed Sep. 20, 2010, the entire contents of which are incorporated herein by reference.

Although nanotube solutions of ultra-high purity may be used to produce semiconductor devices in CMOS-grade facilities, experiences show that the nanotube films (also referred to as nanotube fabrics or, simply, nanofabrics within the present disclosure) formed from such nanotube solutions may be peeled off during the many chemical and physical manufacturing processes, such as coating, baking, curing, etching, polishing, etc. To enhance the adhesion of the nanotubes in the deposited nanotube fabric during processing and hence increase resistance toward the nanotube films from peeling off during the manufacturing processes, the nanotube solutions have to be further processed or treated, so as to enhance the adhesion property of the nanotube films formed from the nanotube solutions.

Molecular Additive Treatment

In one embodiment, a nanotube solution may be treated with a molecular additive, so as to enhance the adhesion property of a nanotube film. Generally, the molecular additive treatment is performed after the nanotube solution is purified or processed and before coating the nanotube solution on a substrate. Depending on the circumstances, however, the molecular additive treatment may be performed before the purification processes or between successive purification processes.

In one embodiment, the molecular additive may be selected in accordance with the following criteria. First, the molecular additive must be soluble in the solvent of the nanotube solution. Because aqueous nanotube solution is used and described throughout this disclosure, the molecular additive must be water soluble. Second, the molecular additive should contain no metal ions in the molecular structure. As discussed above, metal ions may affect the electrical property of the nanotube films. Accordingly, metal ions (as well as metal oxides and metal complexes) are undesirable in the nanotube solution.

In addition, the molecular additive should not degrade the stability of the nanotube solution. That is, the treatment of molecular additive should not adversely affect the colloidal stability of the nanotube solution and should not significantly shorten the shelf-life of the nanotube solution. This may manifest itself in the appearance of large, greater than 3-5 nm particulates of silicates that are visible with scanning electron or optical microscopes, or in the appearance of large, greater than 10 nm clumps of nanotubes that often show a nucleating particle of colloidal oxide at its center, e.g., silica. Moreover, the molecular additive should not adversely affect the quality or electrical property of the nanotube film in its application, for example, as a switchable resistor/transistor element in an advanced nonvolatile memory application. See, for example, J. M. Fedeyko et al., "Spontaneous Formation of Silica Nanoparticles in Basic Solutions of Small Tetraalkylammonium Cations," J. Phys. Chem. B, vol. 108, pp. 12271-12275 (2004).

Several molecular additives meeting these criteria are selected for experimentation. It appears that a nanotube solution being treated with a water soluble silsesquioxane cage molecule can be used to form a nanotube film with enhanced adhesion property. Silsesquioxanes type cage molecule may have various different three-dimensional structures. Among the different three-dimensional structures, cubes, hexagonal prisms, and octagonal prisms are the most common ones. In this disclosure, a molecule may be considered as a "cage" molecule when atoms of the molecule are bonded via covalent bonds and are arranged in a three-dimensional polyhedral structure with high symmetry. See, for example, Abe et al., "Oligo- and polysiloxanes," Progress in Polymer Science, vol. 29, pp. 149-182 (2004).

In another embodiment, the molecular additive may be a germanium containing compound, which may be a precursor to a soluble germanium oxide. For example, one may use $GeO_2$ as the molecular additive, and dissolve $GeO_2$ in water to a concentration below its saturation limit. Discussions on the solubility of germania in water can be found in, for example, M. K. Murphy et al., Journal of the American Ceramic Society—Discussions and Notes, vol. 48, pp. 109-110 (1965). Alternatively, more complex germanium-containing compounds may be used as the molecular additive. Such germanium compounds may include mobile heteroatom ligands, such as alkoxides, amides, carboxylates, and hydrides. See, for example, J. D. Rimer et al., "Self-Assembly and Phase Behavior of Germanium Oxide Nanoparticles in Basic Aqueous Solutions," Langmuir, vol. 23, pp. 2784-2791 (2007).

Upon hydrolysis, the germanium-containing compounds yield germanium oxide nanoparticles whose dimensions are on the order of 0.5 to 3 nm. By maintaining the concentration of germanium in the colloidal formulation to below some critical concentration values, these nanoparticles retain a molecular scale size that is small relative to the void dimensions of the nanotube fabric, typically 5 to 50 nm. This renders the surface of the nanofabric to be more uniform and homogeneous for small dimensional scale applications, such as micro electronic applications.

Referring to FIG. 1, there is illustrated a chemical structure of the molecular additive in accordance with one embodiment of the present disclosure. The molecular additive may be a water soluble silsesquioxane cage molecule having functional groups R1. In some cases, commercial products of silsesquioxane cage molecules may come in powder form and may be electrically neutral, i.e., a salt. Accordingly, the silsesquioxane cage molecules may be coupled with functional groups R2, which may neutralize the charges on functional groups R1.

Figure 2:
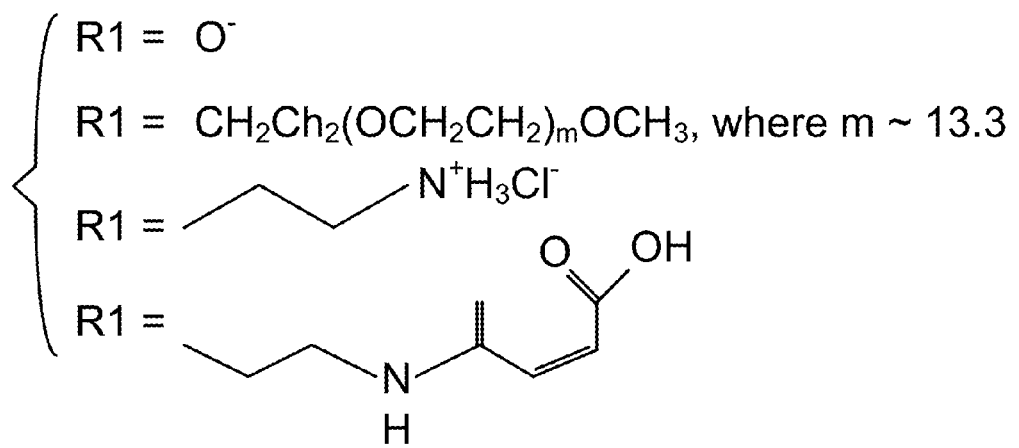
FIG. 2 illustrates possible functional groups R1 and R2 for the molecular additive shown in FIG. 1.
Figure 2:
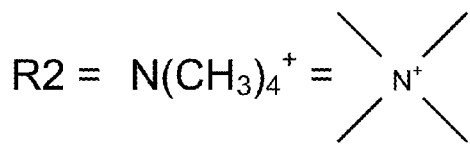

As shown in FIG. 1, silsesquioxane cage molecule is a compound having empirical chemical formula of R1 $(SiO_{3/2})$, where Si is silicon, O is oxygen, and R1 is a functional group. The silsesquioxane cage molecule may be categorized in accordance with functional group R1, which may be hydrogen, an alkyl, alkene, aryl, arylene group, or other functional groups. Several commercially available silsesquioxane cage molecules having different functional groups R1 may be used to treat a nanotube solution. FIG. 2 illustrates these possible functional groups R1. Utilizing derivatives of cage additives where the R1 groups represent atoms of attachment to the Si, whereby the groups readily can migrate on and off of the silicon depending on the solution conditions, is the most desirable. This includes heteroatom attachments such as oxygen, nitrogen, halogens, and hydrides. Alkyl and aryl groups are of a much lower migratory aptitude and the nature of their oxide products in solution may look less like simple silicates than with the high migratory groups, although they may still be effective in promoting adhesion in some cases, notably in solvent environments that are not completely aqueous. FIG. 2 also illustrates an exemplary functional group R2, which may neutralize the charges on the silsesquioxane cage molecules.

Among the several silsesquioxane cage molecules that satisfy the above-mentioned selection criteria, Octakis(tetramethylammonium)-T8-Silsesquioxane or PSS hydrate-Octakis(tetramethylammonium) substituted, referred to herein simply as "T8," appears to give the best results in improving the adhesion property of a nanotube film. In one example, the T8 molecule may be referred to as OctaTMA POSS®, which is commercially available from Hybrid Plastics, Inc. In this case, the T8 molecule is a silsesquioxane cage molecule, as shown in FIG. 1, where functional group R1 is a negatively charged oxygen ion and functional group R2 is a positively charged tetramethyl ammonium (TMA) ion. It is believed that T8 can be dissolved in the aqueous nanotube solution to form silicon dioxide ($SiO_2$) or silica, which contributes to the enhanced adhesion property of the nanotube films. By utilizing TMA as the counter ion to the T8 anion, we avoid the addition of a metal counter ion to electrically balance the negatively charged, functionalized nanotubes.

In one embodiment, nanotube solutions are treated with different quantities of T8, so as to study the effect of T8 treatments on the adhesion and other properties of nanotube films. First, a nanotube solution is prepared by purifying or pre-processing a mixture of nanotubes and a solvent. Then, the nanotube solution is poured into different beakers, such that each beaker contains a nanotube solution of substantially equal quantity (e.g., 30 ml) and substantially equal quality (e.g., purity, nanotube concentration, etc.).

In one embodiment, six beakers of nanotube solutions are used to perform the experiment. The nanotube solution in beaker no. 1 is not treated with T8. Accordingly, the nominal silica content in beaker one is substantially zero. The nanotube solutions in beaker no. 2 through beaker no. 6 are treated with T8. The T8 treatment can be performed under room temperature (i.e., about 20 to 25° C.) and can be completed immediately (i.e., within only a few seconds) after T8 is added and mixed with the nanotube solution.

In one embodiment, the nominal silica contents in beaker no. 2 through beaker no. 6 correspond respectively to concentrations of about 0.12%, 0.06%, 0.04%, and 0.02%, and 0.0045%. The nominal silica content/concentration may be determined based on molecular formula. For example, based on the molecular formula of T8, one T8 molecule constitutes about 45% of $SiO_2$. Accordingly, a 1% T8-treated nanotube solution would nominally contain about 0.45% of $SiO_2$. For example, to make 30 ml of the T8-treated nanotube solution with a nominal silica concentration of about 0.06%, one may add about 4 ml (i.e., (30 ml×0.06%)/0.45%=4 ml) of the 1% T8-only solution (i.e., a solution having T8 as solute) to about 26 ml of a non-T8-treated nanotube solution. The nominal silica contents of the beakers are summarized in below TABLE 1.

TABLE 1

| Beaker No. | Nanotube Solution | Nominal $SiO_2$ Content | Peeling? |
|---|---|---|---|
| 1 | Aqueous CNT Solution without Additive | — | Yes |
| 2 | Aqueous CNT Solution with Additive | 0.12% | No |
| 3 | Aqueous CNT Solution with Additive | 0.06% | No |
| 4 | Aqueous CNT Solution with Additive | 0.04% | No |
| 5 | Aqueous CNT Solution with Additive | 0.02% | No |
| 6 | Aqueous CNT Solution with Additive | 0.0045% | Partial |

Figure 10A:
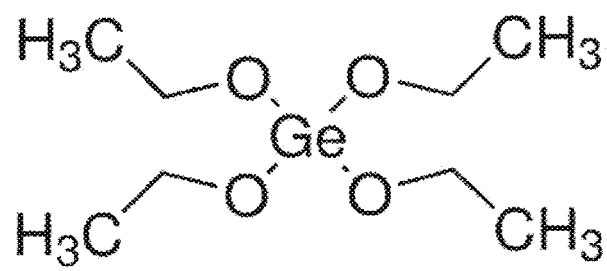
FIGS. 10A through 10C illustrate the structures of germanium compounds, which may be used as the molecular additive, in accordance with another embodiment of the present disclosure.
Figure 10B:
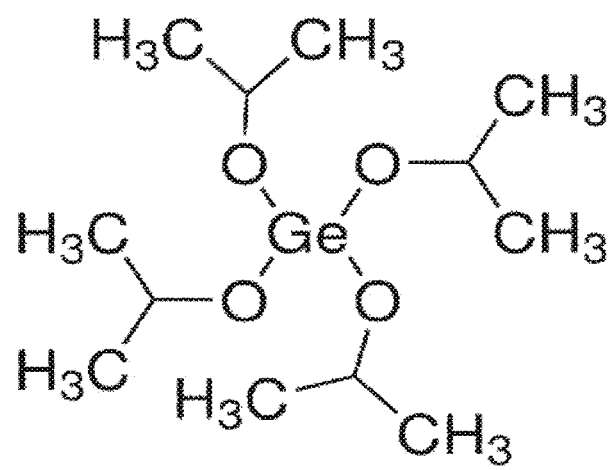
Figure 10C:
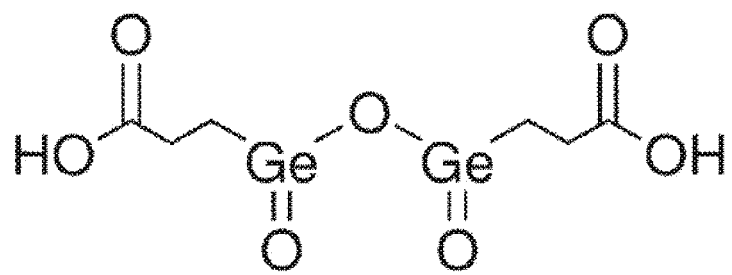

Although the above description focuses on silicon-based molecular additives, it is to be understood that other types of molecular additives may also be used to treat nanotube solutions, so as to reveal enhanced adhesion property in nanofabrics. For example, FIGS. 10A through 10C illustrate the structures of germanium compounds, which may be used as the molecular additive, in accordance with another embodiment of the present disclosure. Exemplary germanium compounds include germanium ethoxide (see, FIG. 10A), germanium isopropoxide (see, FIG. 10B), bis(2-carboxyethylgermanium) sesquioxide (see, FIG. 10C), or polygermsesquioxanes. In general, the predetermined amount of molecular additives corresponds to a germanium concentration of the treated nanotube solution that is less than the solubility limit of the corresponding colloidal germanium species generated in the formulated solution.

Nanotube Film Having Enhanced Adhesion Property

FIGS. 3A through 3F are SEM photographs of nanotube films formed by coating nanotube solutions on a substrate. The nanotube solutions are treated with different amounts of the molecular additive in accordance with one embodiment of the present disclosure.

Figure 3A:
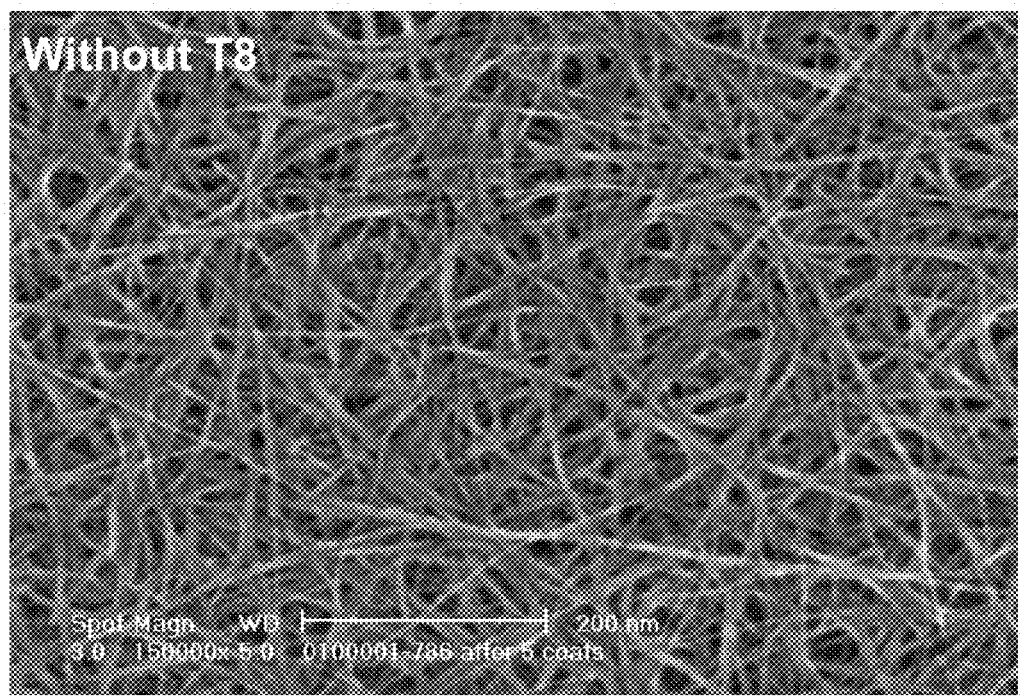
FIGS. 3A through 3F are photographs of nanotube films taken by a scanning electron microscope (SEM). The nanotube films are formed by coating nanotube solutions on a substrate. The nanotube solutions are treated with different amounts of the molecular additive in accordance with one embodiment of the present disclosure.

Referring to FIG. 3A, there is shown a nanotube film formed from the nanotube solution in beaker no. 1 (not treated with T8). Because the nanotube solution is not treated with T8, no silica particles are observed.

Figure 3B:
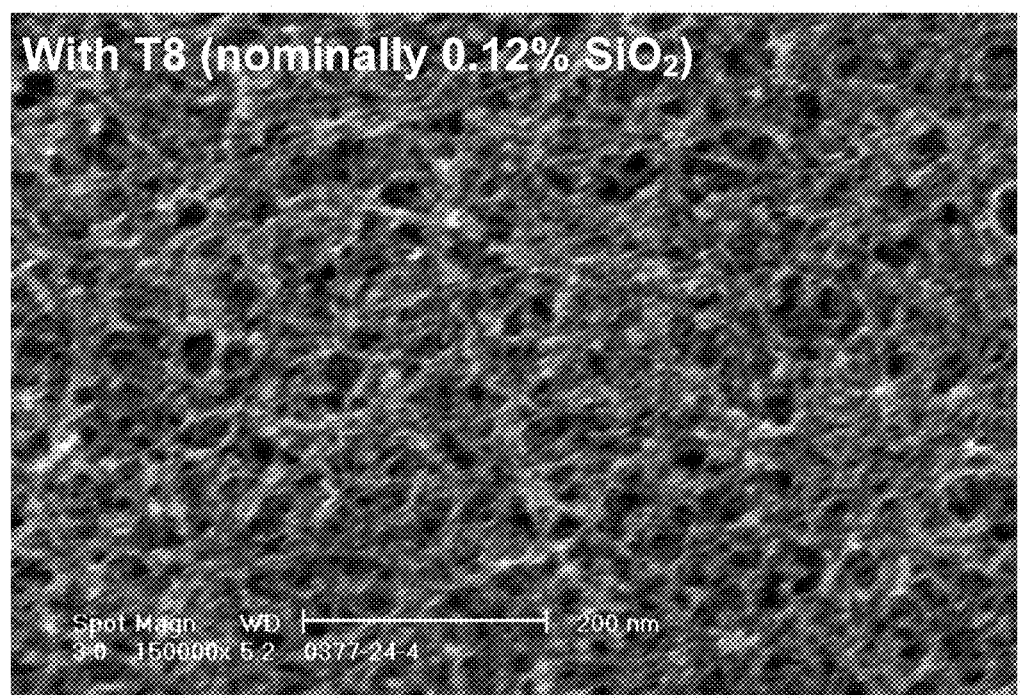

Referring to FIG. 3B, there is shown a nanotube film formed from the nanotube solution in beaker no. 2, which contains about 0.12% of nominal $SiO_2$ content. At this concentration of nominal silica content, a tremendous amount of silica particles is visible in the nanotube film, which renders the quality of this nanotube film unsatisfactory.

Figure 3C:
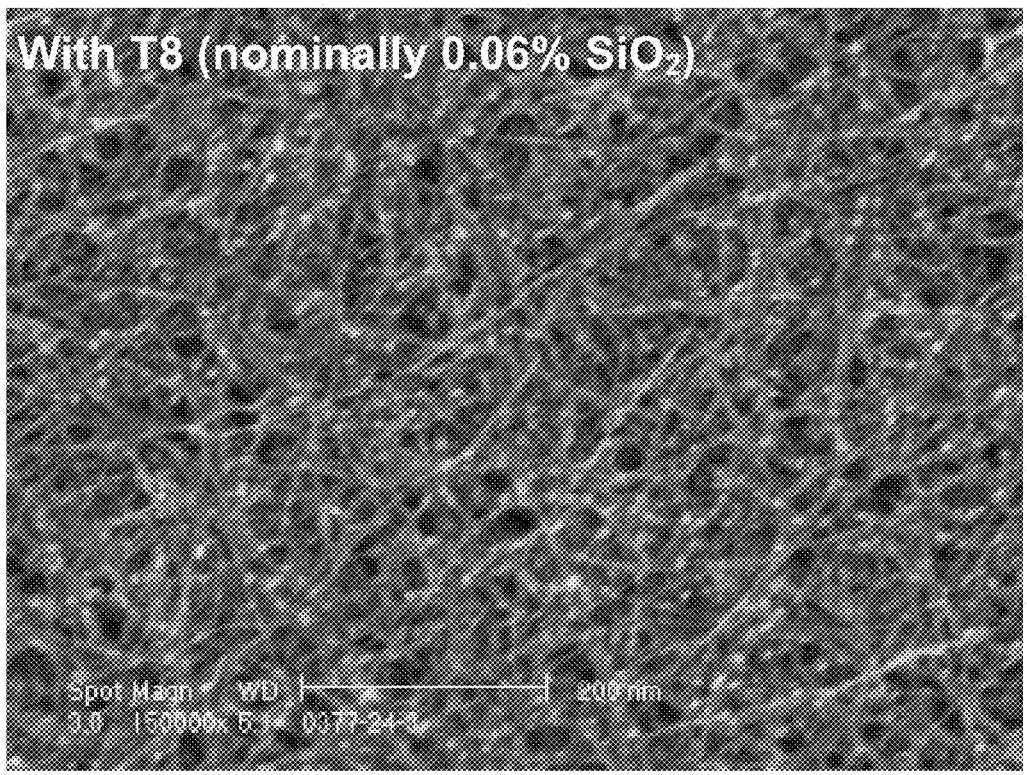

Referring to FIG. 3C, there is shown a nanotube film formed from the nanotube solution in beaker no. 3, which contains about 0.06% of nominal $SiO_2$ content. Although less silica particles are visible in FIG. 3C than in FIG. 3B, the nanotube film thus formed is still not of satisfactory quality. Accordingly, the nanotube film formed from the nanotube solution in beaker no. 3 cannot be used for further processing.

Figure 3D:
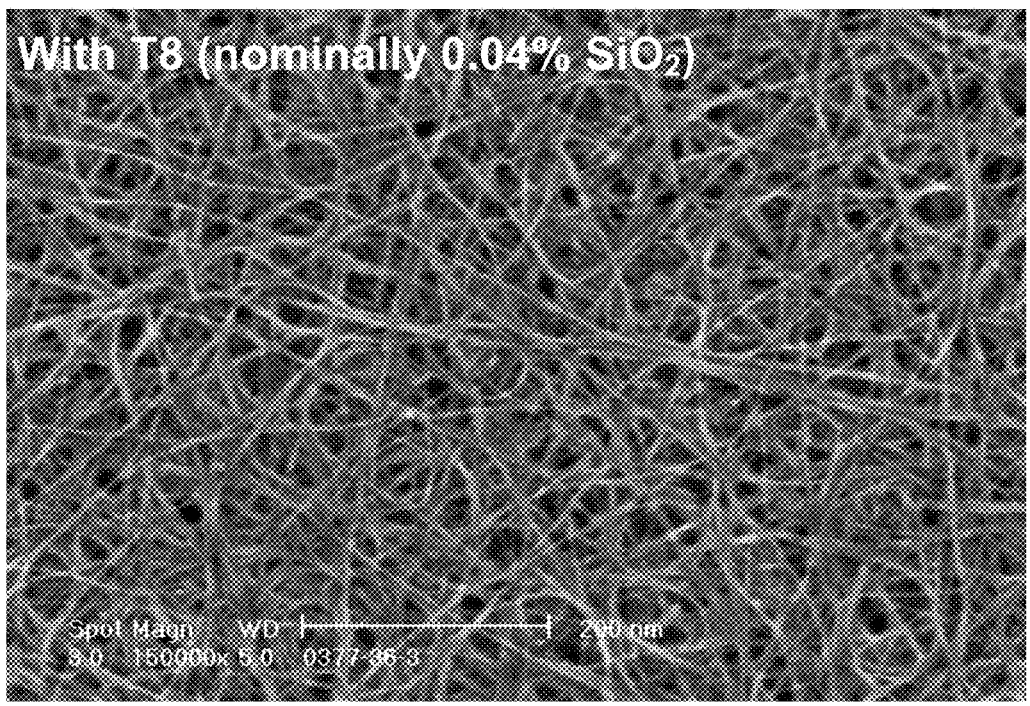

Referring to FIG. 3D, there is shown a nanotube film formed from the nanotube solution in beaker no. 4, which contains about 0.04% of nominal $SiO_2$ content. At this concentration of nominal silica content, no silica particles are observed in the SEM photograph. Accordingly, the nanotube film in FIG. 3D is considered as having a satisfactory quality.

Figure 3E:
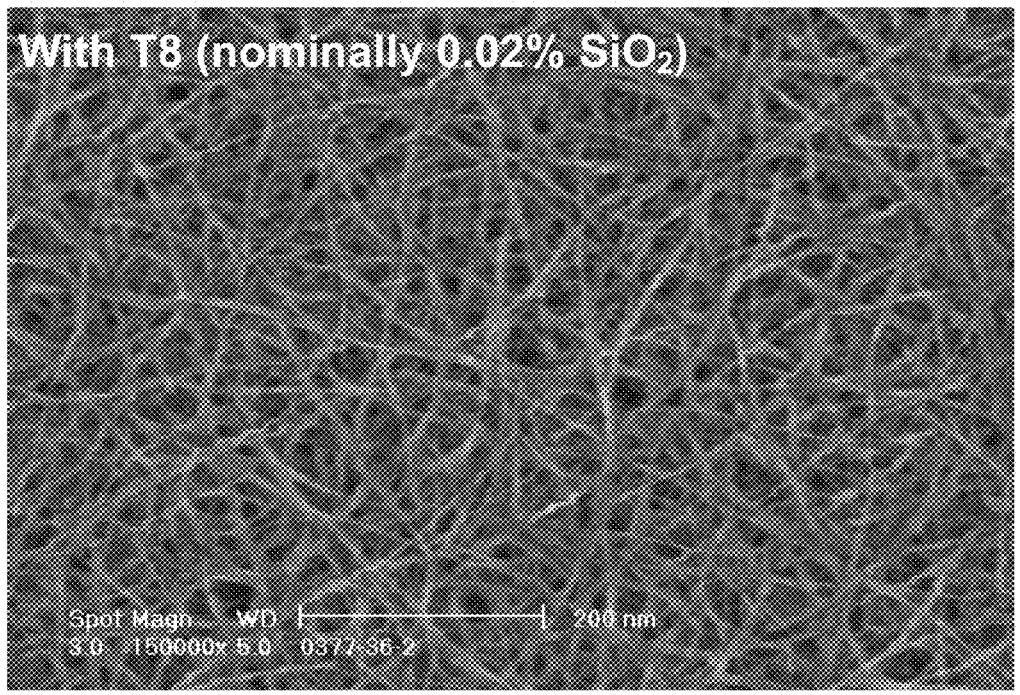

Referring to FIG. 3E, there is shown a nanotube film formed from the nanotube solution in beaker no. 5, which contains about 0.02% of nominal $SiO_2$ content. At this concentration of nominal silica content, no silica particles are observed in the SEM photograph. Accordingly, the nanotube film in FIG. 3E is considered as having a satisfactory quality.

Figure 3F:
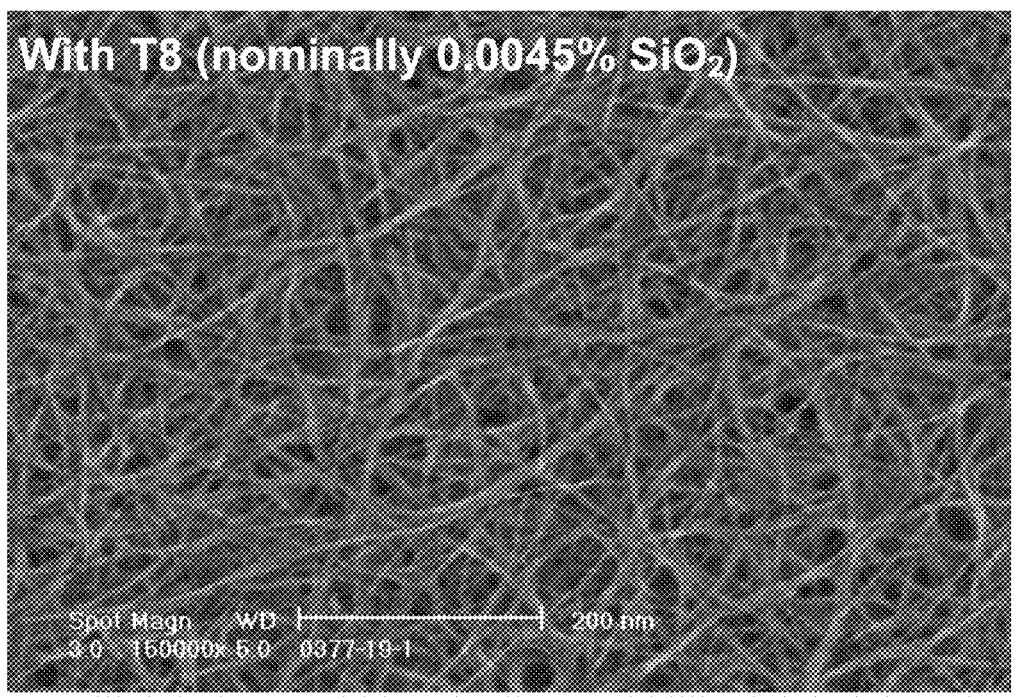

Referring to FIG. 3F, there is shown a nanotube film formed from the nanotube solution in beaker no. 6, which contains about 0.0045% of nominal $SiO_2$ content. At this concentration of nominal silica content, no silica particles are observed in the SEM photograph. Accordingly, the nanotube film in FIG. 3F is considered as having a satisfactory quality.

Based on AFM measurements, the silica particle size in the nanotube film is about 4-5 nm if the nanotube solution is treated with T8 at nominal silica concentrations of 0.06% or higher. In addition, the SEM photographs demonstrate that no silica particles are observed in the nanotube films formed from nanotube solutions having nominal silica concentration of about 0.04% or less. Accordingly, the T8-treated nanotube solution having a nominal silica concentration of about 0.04% or less can be used to form a nanotube film with a molecular silica coating. Such molecular silica coating improves the adhesion property of the nanotube film and is invisible in SEM. Accordingly, the nanotube solution comprising nominal silica concentration of about 0.04% or less may be used to form nanotube films with enhanced adhesion property and invisible silica coating.

Figure 4:
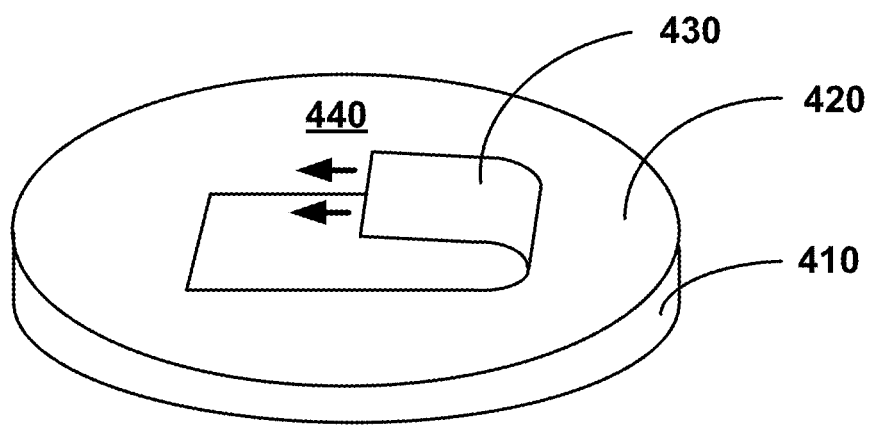
FIG. 4 illustrates a setup of a peeling test to measure the adhesion property of a nanotube film.
Figure 5A:
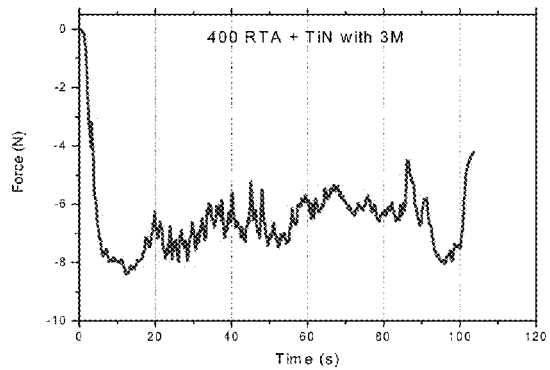
FIGS. 5A through 5F illustrate force measurement results from the peeling test using a first type of adhesive tape.
Figure 6A:
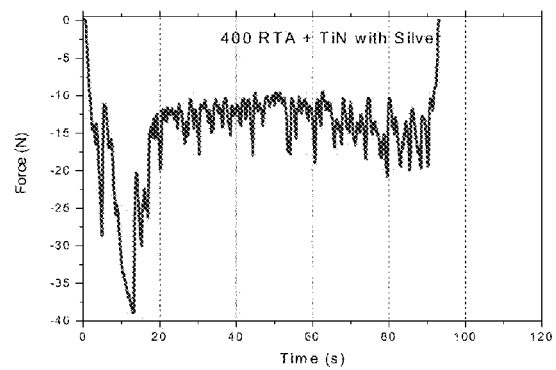
FIGS. 6A through 6F illustrate force measurement results from the peeling test using a second type of adhesive tape.
Figure 5B:
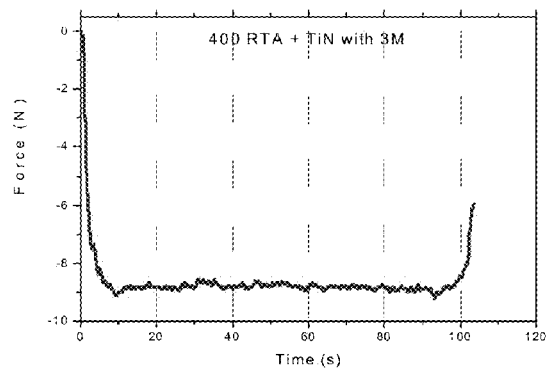
Figure 6B:
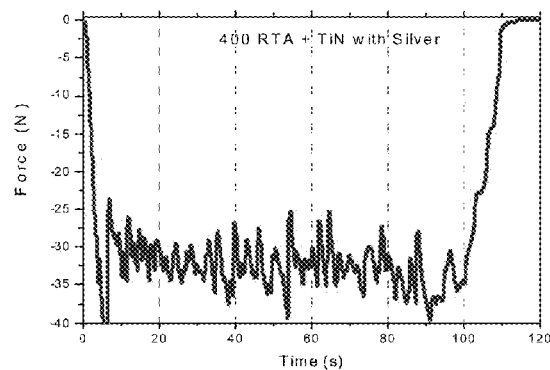
Figure 5C:
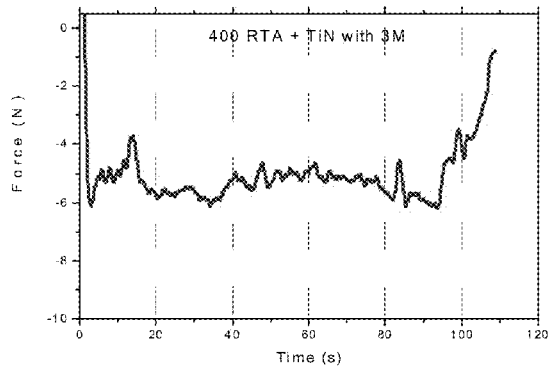
Figure 6C:
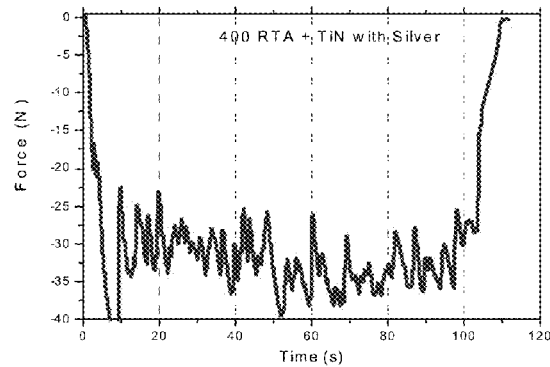
Figure 5D:
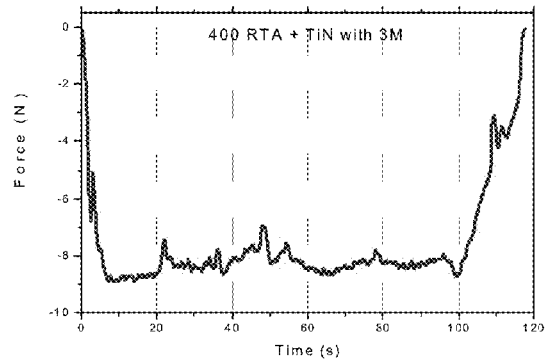
Figure 6D:
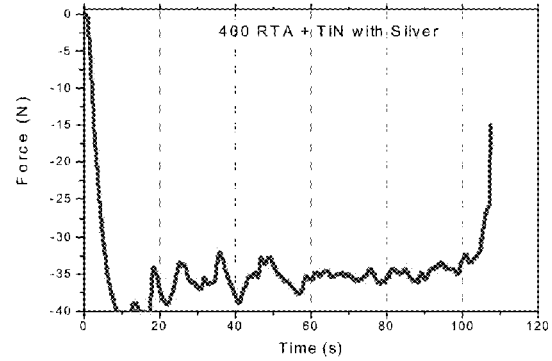
Figure 5E:
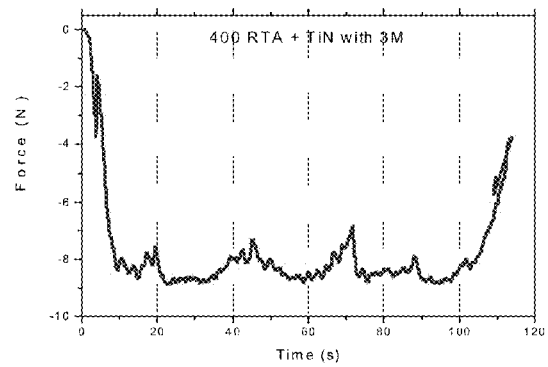
Figure 6E:
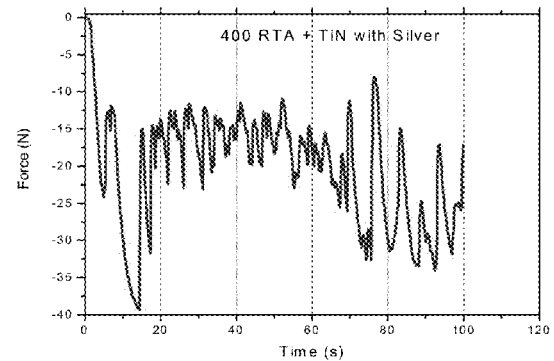
Figure 5F:
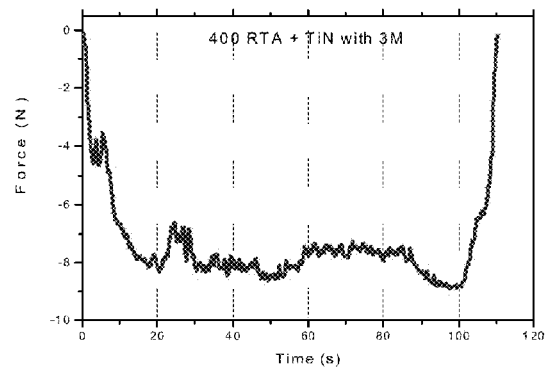
Figure 6F:
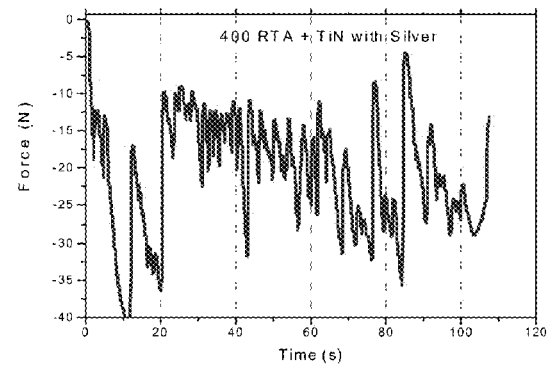

The adhesion property of nanotube films may be tested using various different methods. For example, in FIG. 4, there is illustrated a setup of peeling test to measure the adhesion property of a nanotube film. As shown, a nanotube film 420 is coated on an upper surface of substrate 410, and an adhesive tape 430 is adhered to nanotube film 420. In this embodiment, substrate 410 is made of titanium nitride (TiN).

Different nanotube films 420 may be formed on different substrates 410 by respectfully spin-coating different nanotube solutions on substrates 410. In this embodiment, the nanotube solutions in beakers no. 1 through no. 6 are used to form nanotube films 420 on substrates 410. Thereafter, the substrates coated with nanotube solutions may be baked in a high temperature environment (e.g., in air at 300° C.) for about 3 minutes. The coating and baking processes may be repeated several times to coat several layers of nanotube films. In one embodiment, the coating and baking processes is repeated for five times to coat five layers of nanotube films.

It should be noted that within the preceding example a baking process was used to remove liquid water from the nanotube film prior to the application of another layer. While an exemplary baking cycle was used (300° C. for 3 minutes), the present disclosure is not limited in this regard. Indeed, dependent on the application, different bake temperatures and times may be used to remove the liquid water on the nanotube film between coating steps. For example, bake temperatures of 75° C., 100° C., 200° C., 400° C. or some range therein may be used for cycle times ranging from a few minutes to a several hours. In addition, as described above a plurality of coating operations may be used to achieve a nanotube film of a desired thickness.

Referring again to FIG. 4, to measure the adhesion property of nanotube film 420 using the peeling test, reactive forces can be measured by pulling adhesive tape 430 along the direction of arrows 440. In this embodiment, the reactive force measures the adhesion property of nanotube films 420 along a tangential direction of the upper surface of substrate 410. It is noted, however, that the adhesion property of nanotube film 420 along an arbitrary direction can be measured by arbitrarily selecting the pulling direction of arrows 440.

In one embodiment, two different types of adhesive tape 430 are selected to perform the peeling test. The first type of adhesive tape is a standard scotch tape manufactured by 3M Corp., which may be procured in a stationary store. The second type of adhesive tape is a silver tape manufactured by Venture Tape Corp., which may be procured in a hardware store. In this embodiment, the second type of adhesive tape is stronger or more adhesive than the first type of adhesive tape. The peeling test may be performed by slowly, uniformly pulling the adhesive types for about 120 seconds.

FIGS. 5A through 5F illustrate force measurements from the peeling test using a first type of adhesive tape. FIGS. 5A through 5F respectively correspond to the force measurements of nanotube films made from nanotube solutions in beakers no. 1 through no. 6. In general, it is observed that an uneven curve in the force measurements may indicate a poor adhesion property and that a smooth curve in the force measurements may indicate a good adhesion property. It is also observed that a low numerical value of force measurements may indicate a poor adhesion property and that a high numerical value of force measurements may indicate a good adhesion property. It is noted, however, that the above observations are not necessarily true in all cases.

In one embodiment, the force measurements in the time range of about 40-100 seconds are used to determine the adhesion property of nanotube films. The average force during the time range of about 40-100 seconds are about 6.42N for FIG. 5A, about 8.81N for FIG. 5B, about 5.23N for FIG. 5C, about 8.19N for FIG. 5D, about 8.30N for FIG. 5E, and about 8.14N for FIG. 5F. Further, the force measurements in the time range of about 40-100 seconds are relatively uneven in FIG. 5A, and the force measurements in the time range of about 40-100 seconds are relatively smooth or even in FIGS. 5B, 5C, 5D, 5E, and 5F. Accordingly, it appears that, with respect to the first type of adhesive tape, the nanotube films in FIGS. 5B through 5F demonstrate enhanced adhesion property.

To verify the enhancement of adhesion property with respect to a stronger adhesive tape, the second type of adhesive tape is used to perform the same pulling test. FIGS. 6A through 6F illustrate force measurement results from the peeling test using a second type of adhesive tape.

In this embodiment, the force measurements in the time range of about 40-90 seconds are used to determine the adhesion property of nanotube films. The average force during the time range of about 40-90 seconds are about 12.95 N for FIG. 6A, about 32.72N for FIG. 6B, about 33.27N for FIG. 6C, about 35.17N for FIG. 6D, about 36.22N for FIG. 6E, and about 20.34N for FIG. 6F. Further, it is observed that the adhesive tape used in FIG. 6A reveals peeling of the nanotube film and that the adhesive tape used to obtain FIG. 6F reveals partial peeling of the nanotube film. Accordingly, it appears that, with respect to the second type of adhesive tape, the nanotube films in FIGS. 6B through 6E demonstrate enhanced adhesion property. These results are also summarized in above Table 1.

Figure 7:
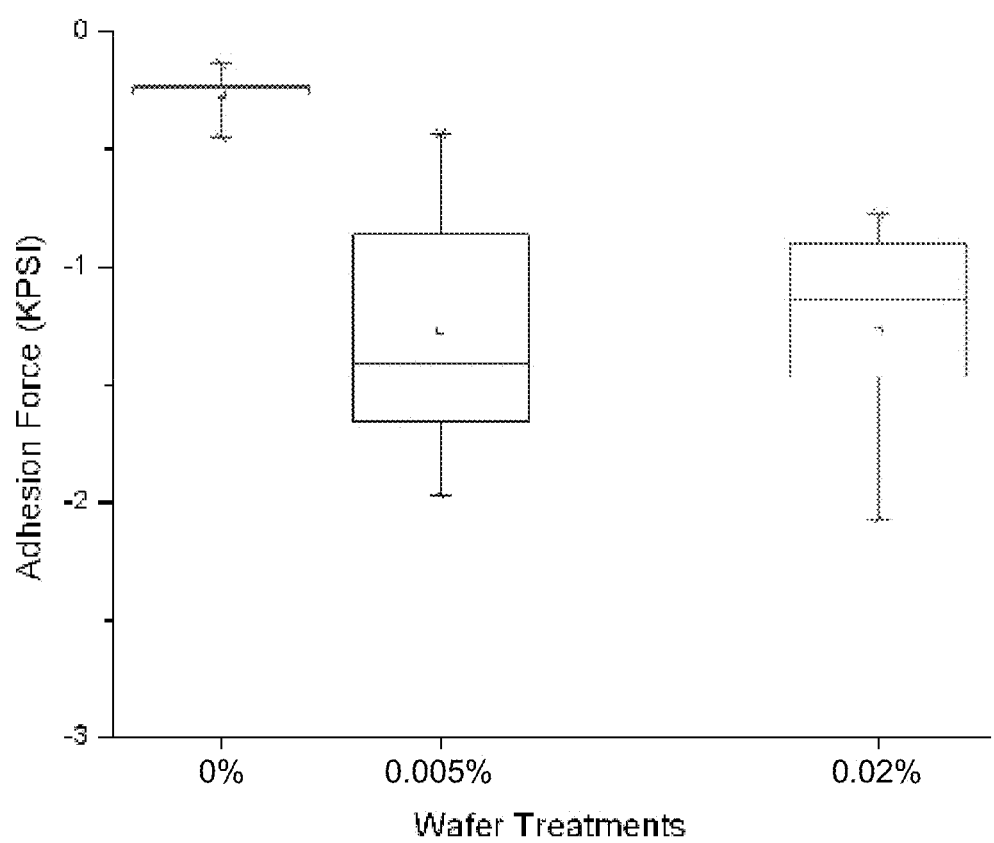
FIG. 7 illustrates the result of a stud pull test performed on nanotube films.

The adhesion property of nanotube films may be tested using a stud pull test. FIG. 7 illustrates the result of a stud pull test performed on three different nanotube films. The first nanotube film is formed from a nanotube solution not treated with T8 (0% of nominal silica content). The second nanotube film is formed from a nanotube solution treated with T8 to give about 0.005% of nominal silica content. The third nanotube film is formed from a nanotube solution treated with T8 to give about 0.02% of nominal silica content. As shown in FIG. 7, the stud pull test for the first nanotube film gives a pulling force of about 0.23 Kpsi. In contrast, the stud pull test for the second and third nanotube films gives an average pulling force of greater than 1 Kpsi. Accordingly, the stud pull test demonstrates that the first nanotube film reveals a fairly poor adhesion property while the second and third nanotube films reveal a greatly improved adhesion property.

Figure 8:
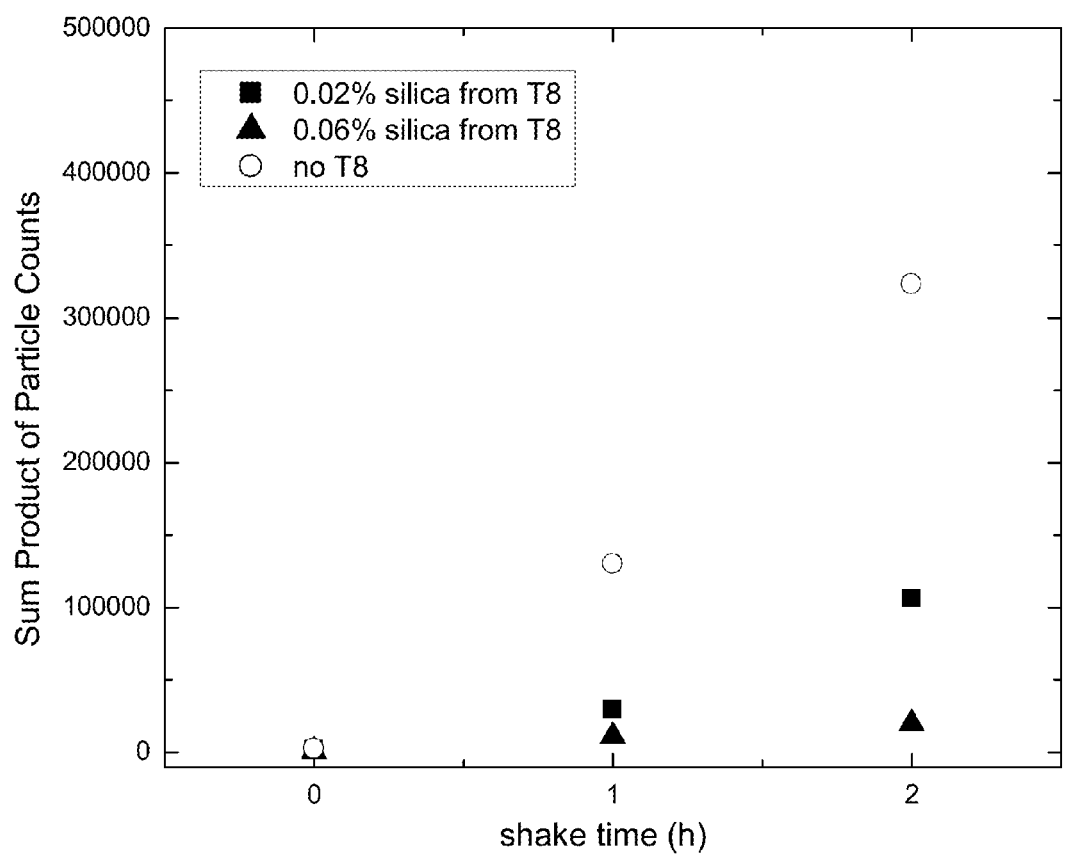
FIG. 8 illustrates a stability test of a nanotube solution treated and not treated with a molecular additive in accordance with one embodiment of the present disclosure.

In addition to enhanced adhesion property, the molecular additive treatment of nanotube solutions may improve other novel properties, such as the shake stability of nanotube solutions. FIG. 8 illustrates a stability test of a nanotube solution treated and not treated with a molecular additive in accordance with one embodiment of the present disclosure. In one embodiment, a nanotube solution having poor shake stability is used to conduct the stability test. About 15 ml of the nanotube solution is used and treated with a predetermined amount of T8. Then, the stability test can be done by measuring the large particle counts in the nanotube solution after shaking the treated nanotube solution for 1 and 2 hours.

In FIG. 8, circles represent sum product of large (0.5-20 um size) particle counts for nanotube solution not treated with T8, and square and triangle dots represent sum product of large (0.5-20 um size) particle counts for nanotube solution treated with T8. As shown in FIG. 8, the particle counts for the nanotube solution treated with T8 are significantly less than the large particle counts for the nanotube solution not treated with T8. Accordingly, the T8 treatment of nanotube solutions can largely improve the shake stability of the nanotube solutions.

Figure 9:
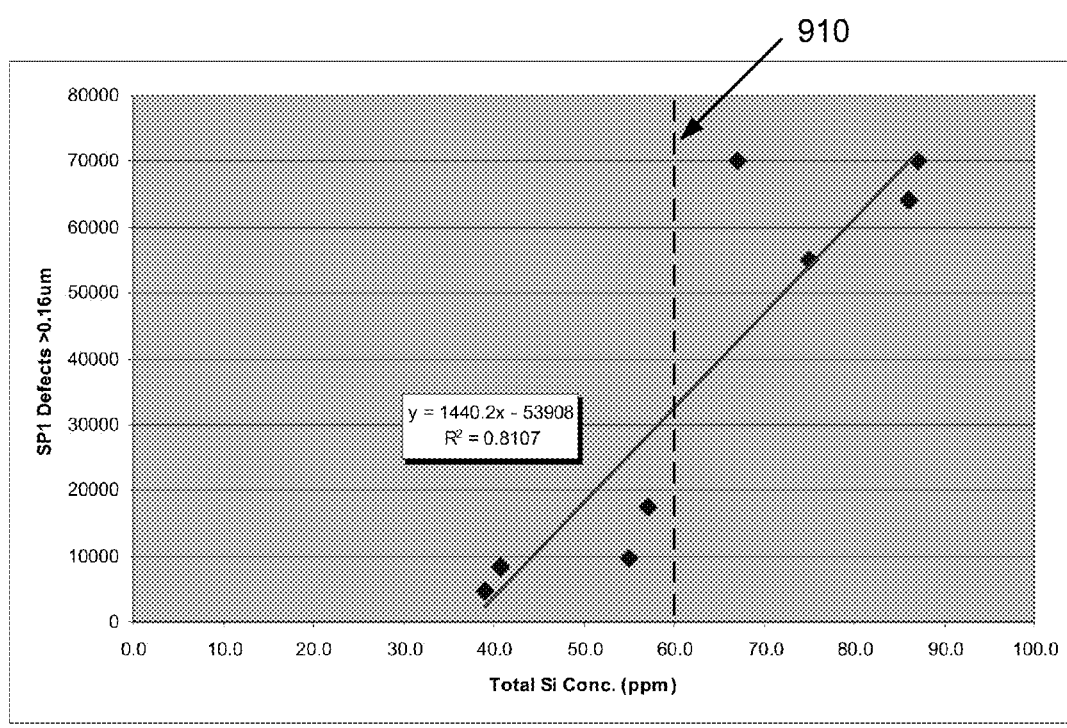
FIG. 9 illustrates a relation of silicon concentrations of nanotube solutions and surface defects of nanotube films made from the nanotube solutions, in accordance with one embodiment of the present disclosure.

FIG. 9 illustrates a relation of silicon concentrations of nanotube solutions and surface defects of nanotube films made from the nanotube solutions, in accordance with one embodiment of the present disclosure. In FIG. 9, each diamond dot represents a nanotube film formed from a nanotube solution, wherein the nanotube solution contains a predetermined concentration of silicon and the nanotube film contains a number of surface defects having a size greater than about 0.16 μm.

The presence of silica in the nanotube solution may functionalize CNT surfaces, and thus could promote surface deposition and precipitation. In general, dissolved silica ($SiO_2$) precipitates in an aqueous solution when the silica concentration goes beyond 150 to 180 ppm. Such precipitation may be worse when OH groups are present in the aqueous solution. See, for example, K. D. Demadis and E. Neofotistou, "Inhibition and Growth Control of Colloidal Silica: Designed Chemical Approaches," Materials Performance, pp. 38-42, April 2004.

In one embodiment, the total silicon concentration is the sum of the silicon concentration contributed from T8 and the silicon concentration already present in the nanotube solution before the T8 treatment. Silicon added from T8 contributes about 20-40 ppm of the total silicon concentration, while silicon in the nanotube solution before treatment contributes about 20 ppm of the total silicon concentration. Because silicon (Si) concentration of about 60 ppm is equivalent to silica ($SiO_2$) concentration of about 128 ppm, which is proximate to the above precipitation threshold, a nanotube solution having total silicon (Si) concentration of less than about 60 ppm tends to produce nanotube films with acceptable quality. As a result, the nanotube solutions represented by the diamond dots to the left of separation line 910 in FIG. 9 may be used to produce nanotube films with sufficient surface quality. On the other hand, the nanotube solutions represented by the diamond dots to the right of separation line 910 in FIG. 9 may produce highly defective nanotube films.

It should be noted that while T8 is used as an exemplary additive within many examples within the present disclosure, the present disclosure is not limited in this regard. Indeed, as illustrated in the discussion of FIG. 9 above, any soluble source of silicon (Si) may be used within the methods of the present disclosure so long as the total silicon (Si) concentration of the solution is below the solubility limit of colloidal silicon (Si). In one non-limiting example, such a solubility limit would be 60 ppm. In another non-limiting example, such a solubility limit would be within the range of 5 ppm to 60 ppm. In still another non-limiting example, such a solubility limit would be a specific concentration value selected from within the range of 5 ppm to 60 ppm.

Moreover, roughness of nanotube films formed from the T8 treated nanotube solutions is also measured. It appears that the nanotube films formed from the T8 treated nanotube solutions exhibit similar roughness profile as compared to the nanotube films formed from the untreated nanotube solutions.

Based on the above observations, we may conclude that the T8 treatment of a nanotube solution may improve the adhesion of the nanotube films formed from the T8-treated nanotube solution. For lower silicon concentrations, the silica in the T8-treated nanotube solution appears to remain molecular in nature and does not appear as particles in the SEM images of the nanotube films. For higher silicon concentrations, it appears that tiny colloidal silica particles start to become observable in the SEM images of the nanotube films. It is to be understood that no conclusion can be reached for the "exact" silicon concentration where such transition takes place. However, existing data suggests that the transition happens at about 60 ppm of the total silicon concentration in the nanotube solution. The total silicon concentration may be calculated as the sum of the silicon concentration contributed from the T8 treatment and the silicon concentration already present in the untreated nanotube solution.

In view of the foregoing, it appears that nanotube films formed from T8-treated nanotube solutions reveal enhanced adhesion property than those formed from non-T8-treated nanotube solutions. It also appears that the silicon concentration contributed from the T8 additive determines the quality of the nanotube films. Experiences show that, when the T8 additive renders the nominal silicon (Si) concentration of nanotube solutions in a range of about 5 ppm to 60 ppm, such nanotube solutions can produce nanotube films with the most satisfactory adhesion property.

It is to be understood that other molecular sources of silicon, especially those compounds with three or more high migratory ligands attached to the Si atom, would also be expected to essentially give the benefits observed with T8. Examples of such compounds include $SiO_2$ dissolved in the CNT formulation, especially at high pH. It is observed that the amount of T8 necessary to add to a solution depends upon how much additional silicon is already present in the CNT solution so as to keep the overall concentration in the range of about 5 to 60 ppm. Other examples include $SiCl_4$, $H_2SiCl_2$, $Si(O\text{-}Et)_4$.

In addition to silicon, other group IV simple oxide formers, such as germanium, may also enhance adhesion of the nanotube films. As with the case of all of these additives, the amount that can be added should be adjusted to maintain the concentration of the oxide forming species below the critical concentration where larger particulates, which are visible in SEM or optical microscopy, begin forming in the deposited film. This may not always be simply the concentration in solution, but dependent upon the rate of particulate formation, as the solvent is evaporated from the deposited nanofabric. As with the T8, this can be readily determined experimentally for a give group IV chemical source. It is appreciated that other group IV oxides, such as tin oxide and/or lead oxide, may also be used to enhance the adhesion property of nanotube films.

Methods for Forming Nanotube Solution and Nanotube Film

Hereinafter, methods for forming or purifying nanotube solutions consistent with the present disclosure are described in detail. The molecular additive treatment of nanotube solutions described above may be integrated with one or more of below method steps. Under some circumstances, however, the nanotube solution may have been purified by and commercially available from certain vendors, before being treated with the molecular additives. Accordingly, one or more of below method steps may not be required to prepare the resulting CMOS-grade nanotube solutions.

One way to fabricate micro-electronic devices from carbon nanotubes is to apply a nanotube solution to a substrate so as to form a nanotube fabric or film. The formulation of carbon nanotube solutions must meet certain trace metal criteria, because metal impurities are killer defects in the CMOS process. Accordingly, to be useful, a nanotube formulation must be sufficiently free from trace metals, so as to be acceptable for integration with existing semiconductor facilities.

In general, a nanotube solution having a trace metal concentration of less than 25 ppb may be considered as acceptable for Back End of Line (BEOL) integration in CMOS facilities. This is equivalent to a trace metal density of about less than $10 \times 10^{10}$ atoms/cm$^2$ on the wafer surface. Such level of trace metal concentration can be achieved by one or more purification methods described in U.S. provisional application No. 61/384,610, entitled "Carbon Nanotube Solutions with Low Contamination and Methods for Purifying Carbon Nanotube Solutions," filed Sep. 20, 2010, the entire contents of which are incorporated herein by reference. See also, for example, U.S. Pat. No. 7,666,382 to Ghenciu et al. and U.S. Pat. No. 7,556,746 to Sen et al., the entire contents of both of which are incorporated herein by reference.

The above requirements for BEOL integration, however, is insufficient in state-of-the-art fabs for Front End of Line (FEOL) integration, where the purity requirement for trace metal is less than 1 ppb in nanotube solution/liquid or less than $5 \times 10^{10}$ atoms/cm$^2$ in the nanotube fabric or film on the wafer substrate. To achieve a purity level of less than 1 ppb trace metal, a judicious choice of CNT raw material or a combination of chemical treatments has to be done in a correct order. The present disclosure provides a method for forming a nanotube formulation with less than 1 ppb trace metals in liquid. Such a nanotube formulation should be acceptable for FEOL integration.

Figure 11:
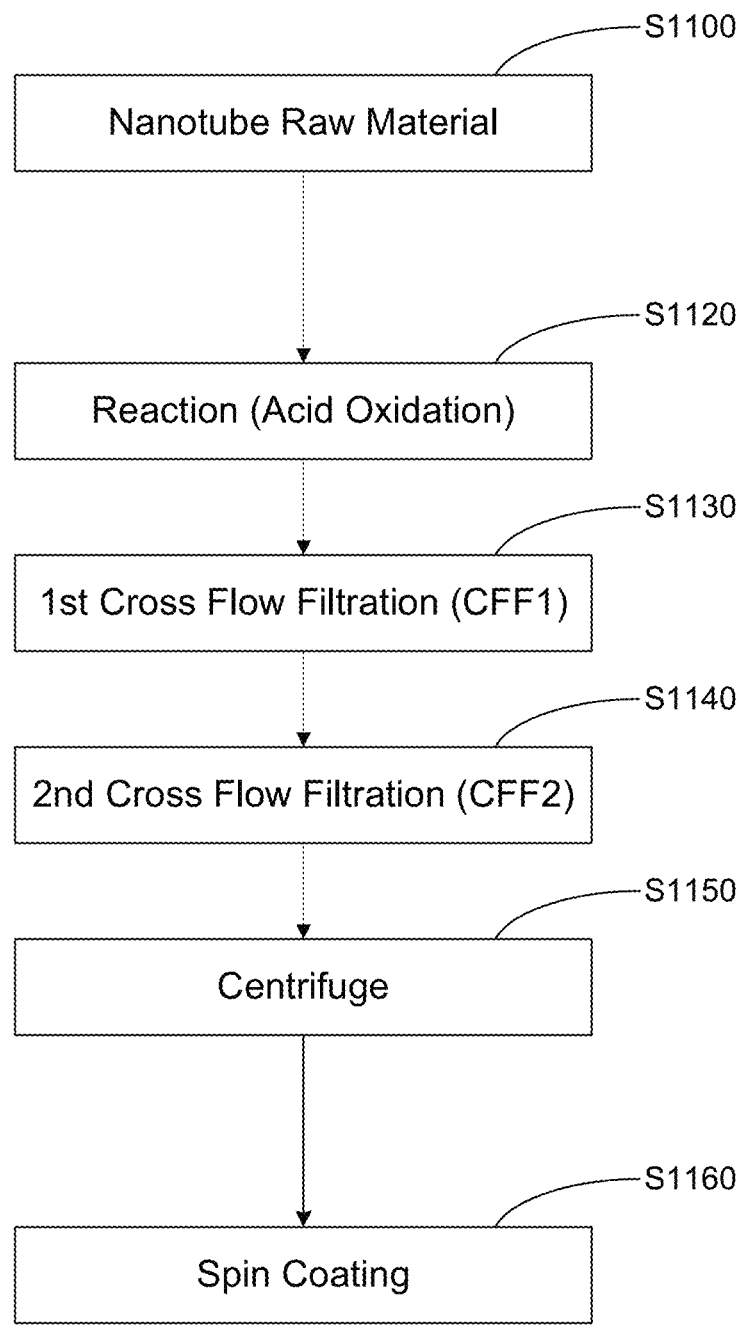
FIG. 11 illustrates a method for forming or purifying nanotube solutions in accordance with one embodiment of the present disclosure.

Referring to FIG. 11, there is illustrated a method for forming or purifying nanotube solutions in accordance with one embodiment of the present disclosure. While various impurities may be removed in one or more steps shown in FIG. 11, this particular example focuses on the removal trace metals in a nanotube solution.

In Step S1100, a CNT or SWNT raw material is selected. If the selected CNT raw material is substantially free from trace metals to begin with, it is possible that a mild acid oxidation treatment and several washes with dilute acid is sufficient to form a nanotube solution that contains less than 1 ppb of trace metal. The process for purifying and formulating such SWNTs is described in, for example, U.S. Pat. No. 7,375,369 to Sen et al. and U.S. Pat. No. 7,666,382 to Ghenciu et al. In one example, the nanotube solution has the following properties: OD=17.9; pH=7.7; FOD=32.77%; and nitrate 15.4 ppm.

In this disclosure, OD of a solution is defined as the optical density of a solution. This is the measured absorbance at a wavelength of 550 nm. In addition, FOD of a solution is defined as a percent value given to a sample to reflect the percentage of free amorphous carbon (aC) of that sample. The FOD number is a percentage change in OD of a filtered sample as compared to the starting sample.

TABLE 2 below summarizes the measurement of trace metal concentration contained in such nanotube solutions. The nanotube solution may then be treated with molecular additives, as described above, so as to enhance the adhesive property of any nanotube films formed therefrom. The nanotube solution formed from pure CNT raw material and treated with the molecular additives may then be used to form a nanotube film with enhanced adhesion property.

TABLE 2

| Trace Metal | Detection Limit (ppb) | Concentration (ppb) |
|---|---|---|
| Al | 0.5 | <0.5 |
| Ca | 0.5 | 0.76 |
| Cr | 0.5 | <0.5 |
| Co | 0.5 | <0.5 |
| Cu | 0.5 | <0.5 |
| Fe | 0.5 | 0.69 |
| Mg | 0.5 | <0.5 |
| Mn | 0.5 | <0.5 |
| Ni | 0.5 | <0.5 |
| K | 0.5 | <0.5 |
| Na | 0.5 | <0.5 |
| Ti | 0.5 | <0.5 |
| Zn | 0.5 | <0.5 |

Before Step S1120, pre-treatment of air oxidation and/or microwave treatment may be performed to the CNT raw material. In addition, a CNT solution may be prepared by dispersing acid oxidized CNT raw materials in a liquid medium such as water. In Step S1120, the nanotubes may be functionalized and oxidized so as to oxidize and dissolve metal catalysts. It has been discovered that carbon nanotubes may form stable dispersions in water, if the nanotubes are pre-treated with oxidizing acid to introduce surface charges onto the CNT surfaces. The acid treatment may also reduce metal impurities to a certain predetermined level. To enhance the homogeneity of the nanotube dispersions, one or more steps of sonicating the CNT solution may be performed. Alternatively or additionally, one or more steps of grinding and/or agitating may be performed to enhance the homogeneity.

After a nanotube solution is formed and before Step S1130, the nanotube solution may undergo successive HCl and nitric treatment steps, with nitric-phosphoric mix, so as to modify reaction chemistry. In Step S1130, a first cross flow filtration (CFF1) process is performed. The CFF1 process washes away soluble metal generated in the reaction step (S1120) in a highly acidic environment (e.g., pH<1). Step S1130 may be repeated for several times.

After Step S1130 and before Step S1140, alternate acid wash processes may be performed to the nanotube solution using, for example, HCl and/or phosphoric acids. Next, in Step S1140, a second cross flow filtration (CFF2) process is performed. The CFF2 process may filter amorphous carbon impurities under basic conditions (e.g., pH~8). Thereafter, in Step S1150, a centrifuge process may be performed to remove clumps and particulate defects in the nanotube solution.

To obtain a nanotube solution that is substantially free from trace metals (e.g., concentration of individual trace metal being less than 1 ppb), various process steps may be perform after the CFF2 process in Step S1140 and/or the centrifuge process in Step S1150. For example, after both Steps S1140 and S1150, the nanotube solution may be treated with, for example, buffer oxide etch (BOE) plus nitric acid wash, pH toggle, cation exchange, chelating agent wash, and/or anion complex. Depending on particular circumstances, the above listed treatments may be performed in any proper order and may be performed either before or after the molecular additive treatment.

BOE Plus Nitric Acid Wash

In one embodiment, a CNT formulation prepared in accordance with the present disclosure may be treated by adding or mixing a mixture of BOE and nitric acid (e.g., $HNO_3$) at room temperature for about 3 to 10 days. In one embodiment, 1:1:1 mixtures are prepared for $HNO_3$ and BOE samples. All samples are allowed to soak in concentrated acid (70% $HNO_3$ and undiluted BOE used) for allotted amount of time (e.g., 10 days). When soaking is completed, the samples are filtered to form a wet cake and washed. In one embodiment, the treated CNT formulation is filtered through a teflon filter membrane and washed several times with 3% nitric acid ($HNO_3$), so as to obtain a wet filter cake of CNT.

Subsequently, the CNT wet cake is transferred to quartz flask containing (basic) distilled water for pH adjustment, and then re-dispersed or re-suspended in the distilled water, targeting an OD of 40, so as to formulate a workable CNT dispersion. The CNT dispersion is then centrifuged to produce the final formulation for testing. The final CNT formulation is substantially free from trace metal (i.e., the concentrations of individual metals are less than 1 ppb) and have the following characteristics: OD=18.2; pH=7.3; nitrate=48 ppm; FOD=36%.

Figure 13:
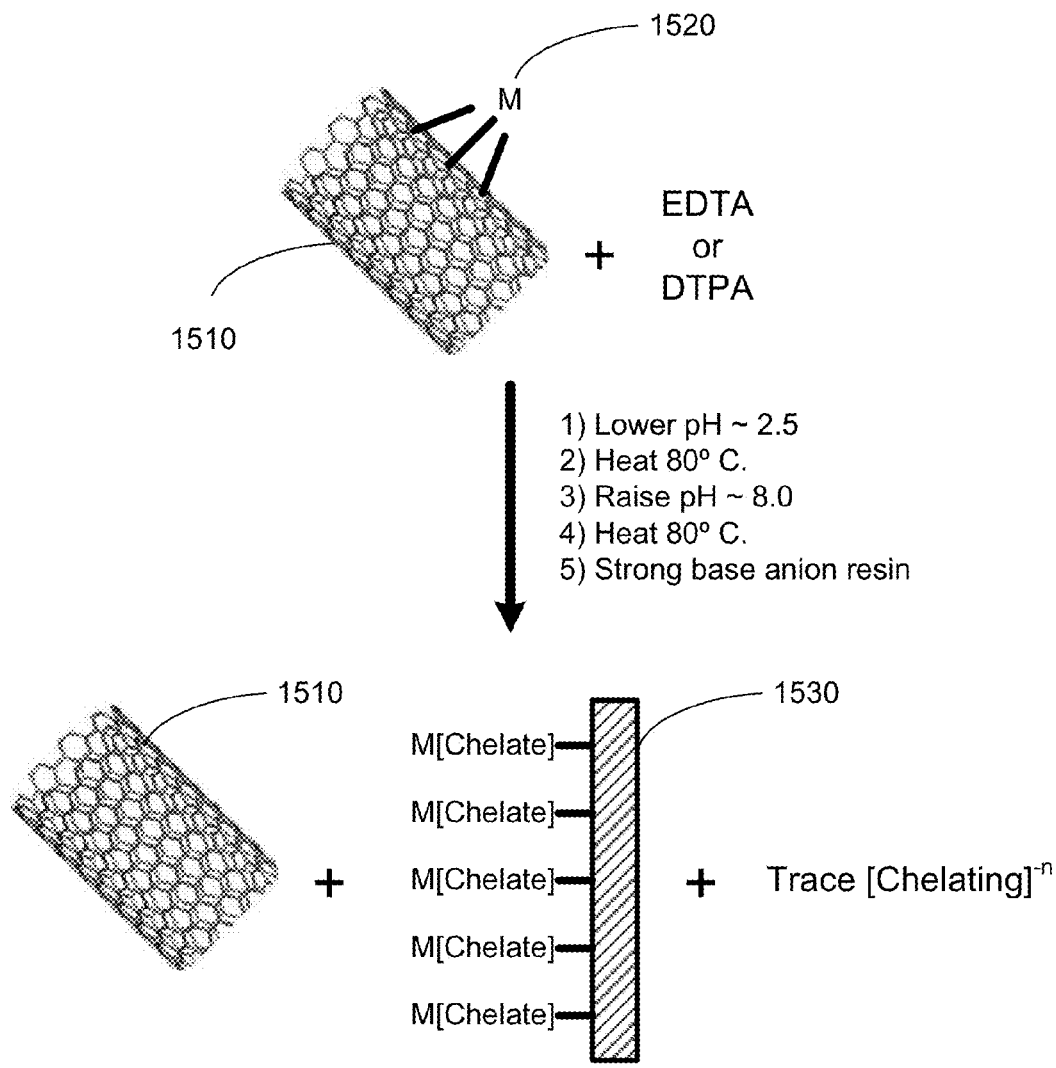
FIG. 13 illustrates a reaction mechanism for the anion complexation process in accordance with one embodiment of the present disclosure.

To date, the treatment of BOE and nitric acid mixture is the most successful option in obtaining CNT formulations with the required metal purity. TABLE 3 below summarizes the measurement of trace metal concentrations contained in the final CNT formulation. Another advantage with the BOE plus Nitric wash method, is that it can dissolve the silica in the base CNT formulation and allow controlling the total Si in the formulation when the Si containing molecular additives are added. FIG. 13 shows an SEM picture of a CNT film formed from the final CNT formulation.

TABLE 3

| Trace Metal | Detection Limit (ppb) | Concentration (ppb) |
|---|---|---|
| Al | 0.5 | <0.5 |
| Ca | 0.5 | <0.5 |
| Cr | 0.5 | <0.5 |
| Co | 0.5 | <0.5 |
| Cu | 0.5 | <0.5 |
| Fe | 0.5 | 0.59 |
| Mg | 0.5 | <0.5 |
| Mn | 0.5 | <0.5 |
| Ni | 0.5 | <0.5 |

TABLE 3-continued

| Trace Metal | Detection Limit (ppb) | Concentration (ppb) |
|---|---|---|
| K | 0.5 | <0.5 |
| Na | 0.5 | <0.5 |
| Ti | 0.5 | <0.5 |
| Zn | 0.5 | 0.61 | pH Toggle

In one embodiment, a nanotube solution, prepared in accordance with the present disclosure, may be treated by pH toggle after the CFF2 process (Step S1140) to remove trace metals. For example, the acidity (pH) of the prepared nanotube solution may be toggled from high (pH>7) to low (pH<7) and back to high (pH>7) again after the CFF2 process. This cycle can be repeated several times. It is shown that the pH toggle process(es) can reduce the concentrations of individual trace metals to less than 1.5 ppb, more specifically iron. The pH toggle process may be further optimized to achieve trace metal concentrations of less than 1 ppb. See example 3 for process details.

In addition to the pH toggle the control of nitrate levels in CFF2 plays an important role on reducing silica levels in CNT formulations where the starting CNT raw material contains high levels of silica. See, for example, U.S. Provisional Application No. 61/384,610, entitled "Nanotube Solutions with High Concentration and Low Contamination and Methods for Purifying Nanotube Solutions," filed on Sep. 20, 2010, the entire contents of which are incorporated herein by reference. Control of silica in the CNT starting formulation is important to making a stable formulation with the Si additives.

Chelating Agent Wash

In one embodiment, a CNT formulation prepared in accordance with the present disclosure may be treated with a chelating agent, such as an oxalic acid (0.1 mM to 100 mM), at room temperature for about 3 to 7 days. The mixture of nanotube solution and the chelating agent is then filtered over a teflon filter membrane and washed several times with 3% nitric acid, so as to obtain a web nanotube filter cake. The wet filter cake is then re-suspended or re-dispersed in basic distilled water to formulate a workable CNT dispersion. Then, the CNT dispersion is further cation exchanged and/or centrifuged to produce the final CNT formulation for examination.

Figure 12:
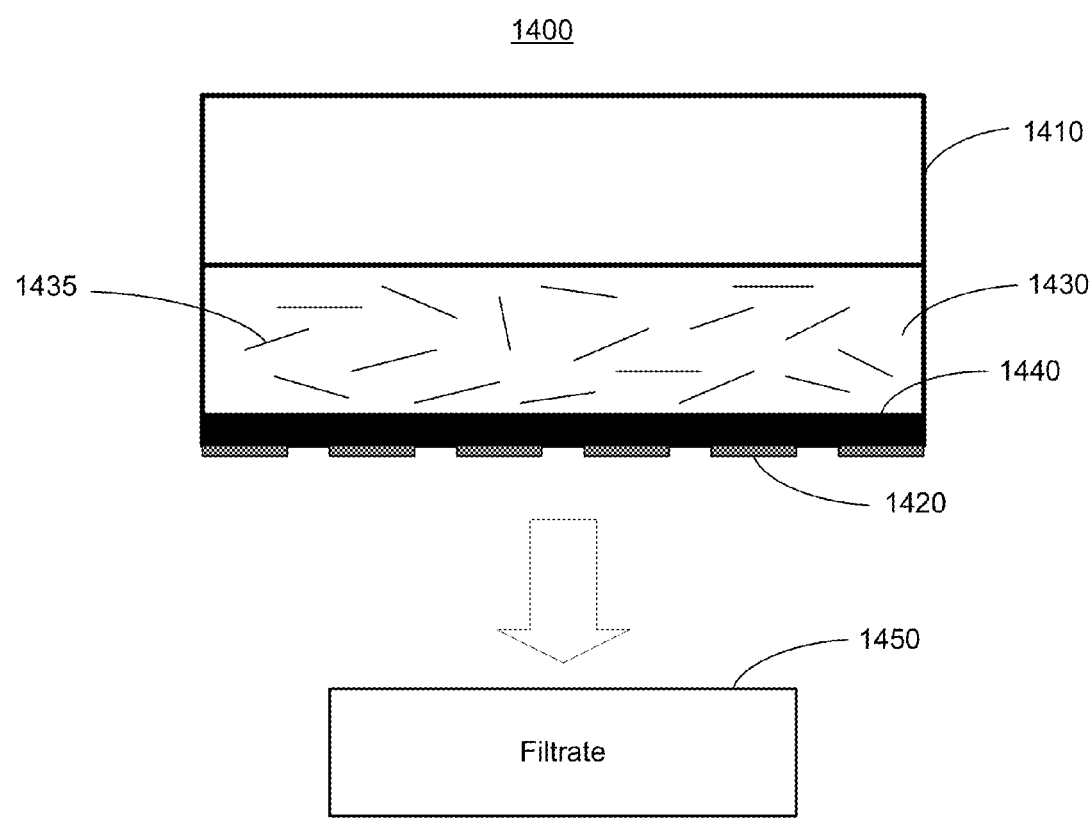
FIG. 12 illustrates a filtration device for examining the CNT dispersion before and after being treated with chelating agent wash in accordance with one embodiment of the present disclosure.

FIG. 12 illustrates a filtration device 1400 for examining the CNT dispersion being treated with the chelating agent wash. Filtration device 1400 includes a container 1410 and a filter membrane 1420 at the bottom of container 1410. Container 1410 holds a CNT solution comprising a liquid medium 1430 and a plurality of carbon nanotubes 1435 dispersed in liquid medium 1430. Filter membrane 1420 allows liquid medium 1430 to flow therethrough and blocks carbon nanotubes 1435. As a result, a CNT filter cake 1440 is formed at the bottom of container 1410 and a filtrate 1450 of the CNT solution is collected and examined.

In one example (control group), a CNT solution containing about 5.3 ppb of iron (Fe) impurity is filtered through membrane 1420. In this example, the CNT solution is not treated with any chelating agent. Filtrate 1450 of the untreated CNT solution is collected and examined. It is found that filtrate 1450 contains about 2.0 ppb of iron. This indicates that trace metals, especially iron, are not filtered out. That is, about 3.3 ppb of iron may still remain in CNT filter cake 1140.

In another example (experimental group), a CNT solution containing about 6.1 ppb of iron (Fe) impurity is filtered through membrane 1420. In this example, the CNT solution is treated with 11 mM of oxalic acid. Filtrate 1450 of the CNT solution is collected and examined. It is found that filtrate 1450 contains about 6.4 ppb of iron. This indicates that trace metals, especially iron, can be completely extracted from the CNT solution. Because the iron concentration in filtrate 1450 is greater than the iron concentration in liquid medium 1430 before filtration, it indicates that he chelating agent treatment may even extract trace metal atoms attached to the nanotube surface, which are not dissolved in liquid medium 1430 before filtration.

Although, at the present time, oxalic acid is found to be the most effective chelating agent in extracting trace metals, it is to be understood that other chelating agents may also be used to extract trace metals. One example is N,N',N"-Tris (3-hydroxy-6-methyl-2-pyridylmethyl)1,4,7-triazacyclononane (TACN-HP) that has been reported to have one the highest binding constant for Fe. A mixture of several chelating agents targeting specific binding to different metal ions can also be used. TABLE 4 below summarizes the measurement of trace metal concentrations contained in an oxalic treated CNT formulation.

TABLE 4

| Trace Metal | Detection Limit (ppb) | Concentration (ppb) |
|---|---|---|
| Al | 0.5 | <1 |
| Ca | 0.5 | <1 |
| Cr | 0.5 | 0.7 |
| Co | 0.5 | <1 |
| Cu | 0.5 | <1 |
| Fe | 0.5 | 1.0 |
| Mg | 0.5 | <1 |
| Mn | 0.5 | <1 |
| Ni | 0.5 | <1 |
| K | 0.5 | <1 |
| Na | 0.5 | <1 |
| Ti | 0.5 | 0.6 |
| Zn | 0.5 | <1 |

Cation Exchange

In one embodiment, cation exchange may be performed to remove free metal ions in a nanotube solution prepared in accordance with the present disclosure. This is particularly effective for removing free metal species, such as Ca and Zn, which are usually environmentally contaminative and are difficult to control. It is shown that cation exchange process can reduce Ca and Zn concentration in the nanotube solution to less than 1 ppb. TABLE 5 below summarizes the trace metal concentrations of the nanotube solution after being treated with the cation exchange process.

TABLE 5

| Trace Metal | Detection Limit (ppb) | Concentration (ppb) CNT formulation high Ca | Concentration (ppb) Same CNT formulation post ion exchange |
|---|---|---|---|
| Al | 1 | 2.7 | 2.8 |
| Ca | 1 | 34.0 | <1 |
| Cr | 1 | <1 | <1 |
| Co | 1 | <1 | <1 |
| Cu | 1 | <1 | <1 |
| Fe | 1 | 6.9 | 5.1 |
| Mg | 1 | 4.4 | <1 |
| Mn | 1 | <1 | <1 |
| Ni | 1 | <1 | <1 |
| K | 1 | <1 | <1 |
| Na | 1 | <1 | <1 |
| Ti | 1 | <1 | <1 |
| Zn | 1 | 1.2 | <1 |

Anion Exchange

Although surface oxides on carbon nanotubes may impart colloidal stability to the nanoparticles in aqueous solutions, surface oxides may also serve as anionic sorption sites for metal cations. As described above, mono- and di-valent cations (or trace metals) from CNT solutions are easily removable by cation exchange methods. However, cation exchange methods may not be sufficiently effective in removing trivalent cations, such as $Fe^{3+}$ and $Al^{3+}$, especially at the ppb levels. This may be due to the metal complexation with the CNT functional groups or the speciation of trivalent cations into insoluble hydroxides.

To effectively remove trivalent cations, a method is developed, in which complexing agents are used to remove 1) metal cations adsorbed to the CNT surface, 2) free cations in the CNT solution, and/or 3) speciated metal hydroxides within the CNT solution. In one embodiment, the complexing agent may be one or more of ethylenediaminetetraacetic acid (EDTA), diethylene triamine pentaacetic acid (DTPA), etidronic acid, and combinations thereof. It is appreciated that other complexing agent may work as well so long as the organometalic complex is anionic.

FIG. 13 illustrates a reaction mechanism for the anion complexation process in accordance with one embodiment of the present disclosure. As shown in FIG. 15, a carbon nanotube 1510 may include metals 1520 bonded on its surface. To remove trace metals 1520 from carbon nanotube 1510, chelating agents may be used to treat carbon nanotubes 1510 in a nanotube solution. In this embodiment, the chelating agents may be EDTA or DPTA. After chelating agent is added to and mixed with the nanotube solution, the pH of the nanotube solution is lowered to about 2.5. The nanotube solution is then heated to 80° C. Then, the pH of the nanotube solution is raised to about 8.0, and the nanotube solution is heated to 80° C. Thereafter, the nanotube solution is passed through a column containing a strong base anion resin 1530, which reacts with the chelating agent, on which the metal ions are bonded. As a result, metals 1520 are removed from the surface of nanotube 1520.

The resulting nanotube solution has the following properties: OD=15.9; pH=8.3; Nitrate=85.3 ppm; FOD=38%; Bright Field=57; Dark Field=196. Anion exchange after generating a negatively charged species by complexing the metal ion with a chelating agent gives a metal concentration of less than 2 ppb in the resulting sample. TABLE 6 below summarizes the measurement of trace metal concentrations contained in the resulting CNT formulation.

TABLE 6

| Trace Metal | Detection Limit (ppb) | Concentration (ppb) |
|---|---|---|
| Al | 0.5 | 1.7 |
| Ca | 0.5 | 0.82 |
| Cr | 0.5 | <0.5 |
| Co | 0.5 | <0.5 |
| Cu | 0.5 | <0.5 |
| Fe | 0.5 | 1.2 |

TABLE 6-continued

| Trace Metal | Detection Limit (ppb) | Concentration (ppb) |
|---|---|---|
| Mg | 0.5 | <0.5 |
| Mn | 0.5 | <0.5 |
| Ni | 0.5 | <0.5 |
| K | 0.5 | <0.5 |
| Na | 0.5 | <0.5 |
| Ti | 0.5 | <0.5 |
| Zn | 0.5 | 1.8 |

Anion Exchange in combination with trace fluorides (<1000 ppm) can also be used to effectively remove silicon from carbon nanotube solutions. In one embodiment, three samples were examined: (1) a control sample, (2) an anion exchanged sample without added fluorides, and (3) an anion exchanged sample with 250 ppm added fluoride. Fluoride added to the nanotube solution is allowed to react overnight (i.e., about 8-12 hours); shorter times may work sufficiently well. Thereafter, each nanotube sample is passed through an anion exchange column. TABLE 7 summarizes the concentration of silicon and fluoride in each sample.

TABLE 7

| Sample | Si Detection Limit (ppm) | Si concentration (ppm) | Final Fluoride concentration (ppm) |
|---|---|---|---|
| As produced CNT solution | 1 | 31 | <1 |
| CNT solution post anion exchange | 1 | 24 | <1 |
| CNT solution with 250 ppm Fluoride from BOE post anion exchange | 0.1 | 0.13 | <1 |

Example 1

This example describes the purification of carbon nanotubes and the preparation of a nanotube formulation with T8 additive. The starting nanotubes and/or nanotube formulation may be prepared using various different methods. See, for example, U.S. Pat. No. 7,666,382 to Ghenciu et al. and U.S. Pat. No. 7,556,746 to Sen et al., the entire contents of both of which are incorporated herein by reference.

Single-walled carbon nanotubes (SWNTs) are purified by mixing 1.5 g of carbon nanotubes with a 750 mL:750 mL mixture of 70% nitric acid:DI water. The nanotube:nitric acid:DI mixture is refluxed for about 8 hours at a temperature of about 112-113° C. The acid refluxed material is washed with 3% nitric acid 5-7 times by a centrifugation-decantation method. Finally, the acid refluxed material is washed 2-3 times with DI water by a centrifugation-decantation method. The sediments from the DI water washed material is transferred to a 1 L flask with 1 L of DI water and sonicated for about 15 minutes. The pH of the suspension is adjusted to about 8 with a few drops of 29% ammonium hydroxide. The suspension is then sonicated for another 15 minutes.

The optical density and pH of the nanotube suspension is measured and the suspension is observed visually, i.e., using naked eyes. If clumps of carbon nanotube aggregates are visually observed in the suspension and the pH is still around 8, then the suspension is sonicated again for about 30 minutes. If carbon nanotube aggregates are visually observed and the pH of the suspension has dropped to less than 7.5, then the pH is adjusted up to around 8 with 1% ammonium hydroxide and the suspension is sonicated for about 30 minutes. This pH adjustment and sonication cycles can be repeated several times until a homogenously dispersed carbon nanotube suspension is obtained. The optical density of the solution is measured at this stage and for typical optical density values measured at 550 nm is 40±10.

The carbon nanotube suspension is then passed through an ion exchange column to remove any free metal ions, such as $Ca^{2+}$, $Zn^{2+}$, $Na^+$, and $K^+$, that might have been inadvertently picked up during the processing. The ion-exchange procedure is carried out by the following procedure. First, the column is charged with cation exchange resin (ID#: Resin-C-381C) commercially available from Siemens Water. Next, the resin bed is rinsed with DIW in reverse flow for about 10-15 minutes to classify the resin particles by size and remove any resin fines. Then, the resin bed is rinsed with DIW in downward flow to compact the resin. The flow adapters are then adjusted to mechanically compress the resin. The resin bed is rinsed with no less than 26 bed volumes of 10% nitric acid at a flow rate of 7 liters per hour. This removes any residual sodium off the resin.

Thereafter, the resin bed is rinsed with DIW to remove any residual nitric acid and trace organics generated during the nitric acid treatment. Next, the carbon nanotube feed tank is connected to the system and the carbon nanotube suspension is pumped through the resin bed at a flow rate of 7 liters per hour, removing any free metal ions from the carbon nanotube suspension. The pH of the ion-exchange carbon nanotube suspension is adjusted up to around 8 with 29% ammonium hydroxide.

A high g centrifugation is then performed on the carbon nanotube suspension to remove particulate impurities. The centrifuge conditions can be about 30,000 to 100,000 g-force for about 10-120 minutes at a temperature of about 10-40° C. The centrifugation may be repeated for several times. In one embodiment, the centrifugation process is performed at about 70,000 g-force for 20 minutes at a temperature of about 15° C. The supernatant liquid is transferred to an adequate container through a pump process, thereby avoiding any possible human contamination or other extraneous contaminants.

A final qualification is performed on the resulting carbon nanotube formulation in the liquid phase and on the films generated therefrom. Films are typically generated by a spin coating process. ICP-MS analysis done on the liquid phase shows that all 13 metal elements tested are below 1 ppb. Si level as tested by ICP-AES is below 0.5 ppm. TABLE 2 summarizes the measurement of trace metal concentrations contained in the resulting carbon nanotube formulation. It is noted that all metal elements are analyzed by ICP-MS/ICP-AES.

To make a carbon nanotube formulation with the T8 additive, an aqueous solution of T8 needs be prepared first. T8 obtained from either Gelest or Plastic Hybrid is dissolved in DI water to a concentration of about 1% by weight. The resulting T8 solution is filtered through a 0.1 um filter cartridge to remove any particulate impurities. The T8 solution can also be ion-exchanged before the filtration step in order to remove any free metal ion. The filtered T8 solution, which may or may not have been ion-exchanged, is added to the carbon nanotube formulation obtained by the procedure described above. The amount of T8 solution to be added can be calculated based on the target Si amount in ppm that is required to be added from the T8. Amount of Si in the stock T8 solution can be determined by ICP-AES analysis.

Figure 14A:
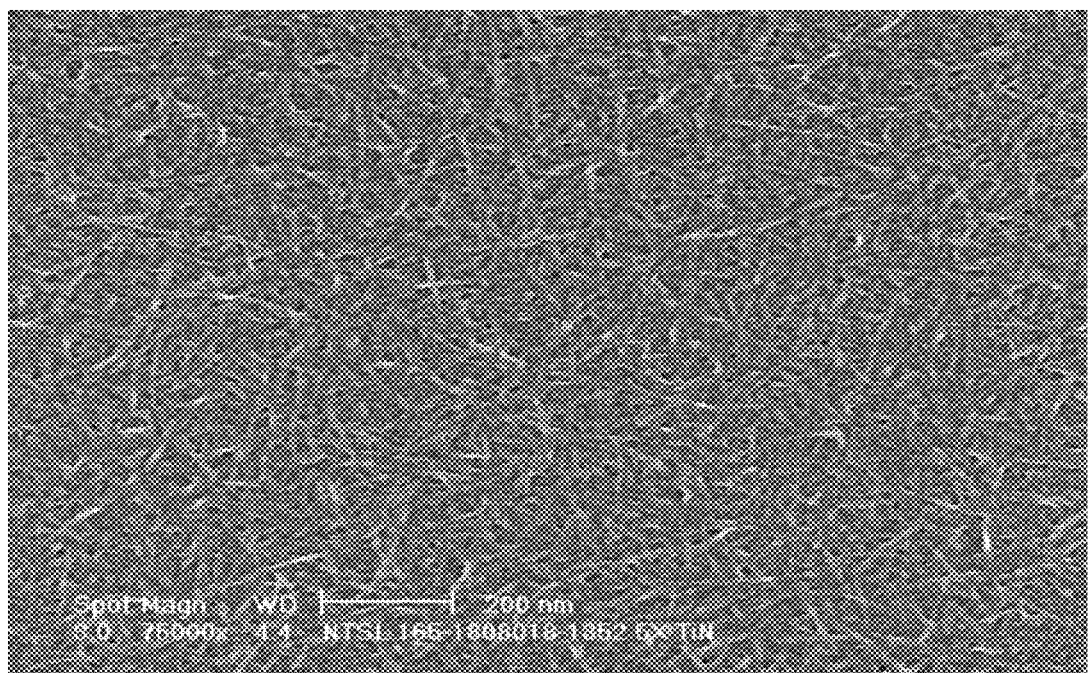
FIGS. 14A and 14B show SEM pictures of carbon nanotube films formed by the procedure described in EXAMPLE 1 below without any T8 additive.
Figure 14B:
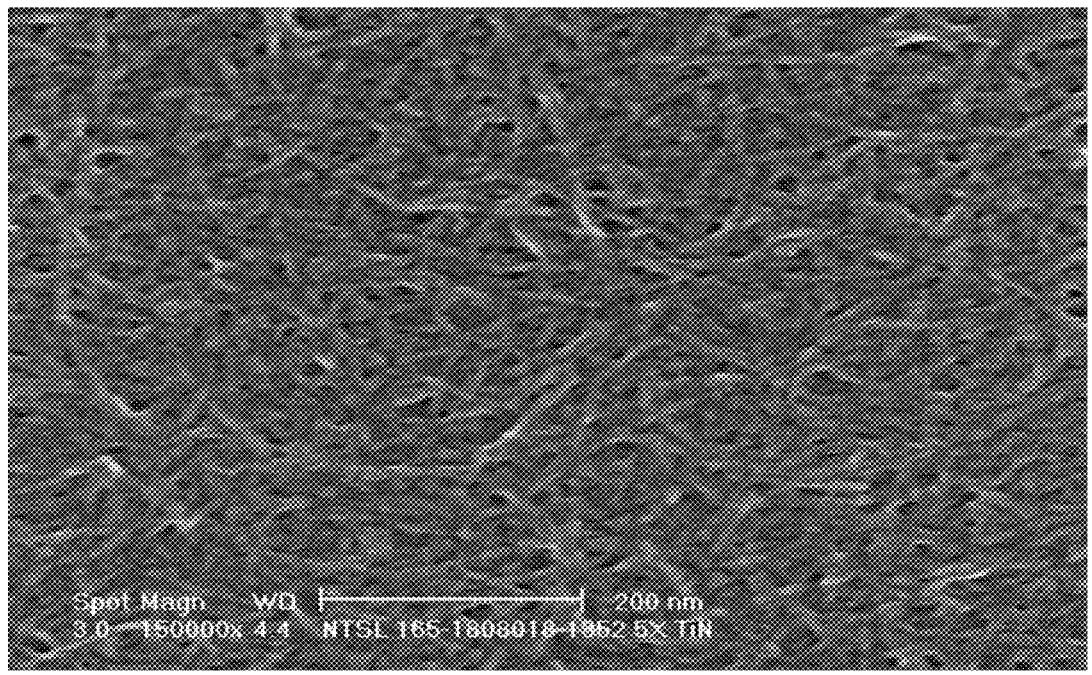
Figure 15A:
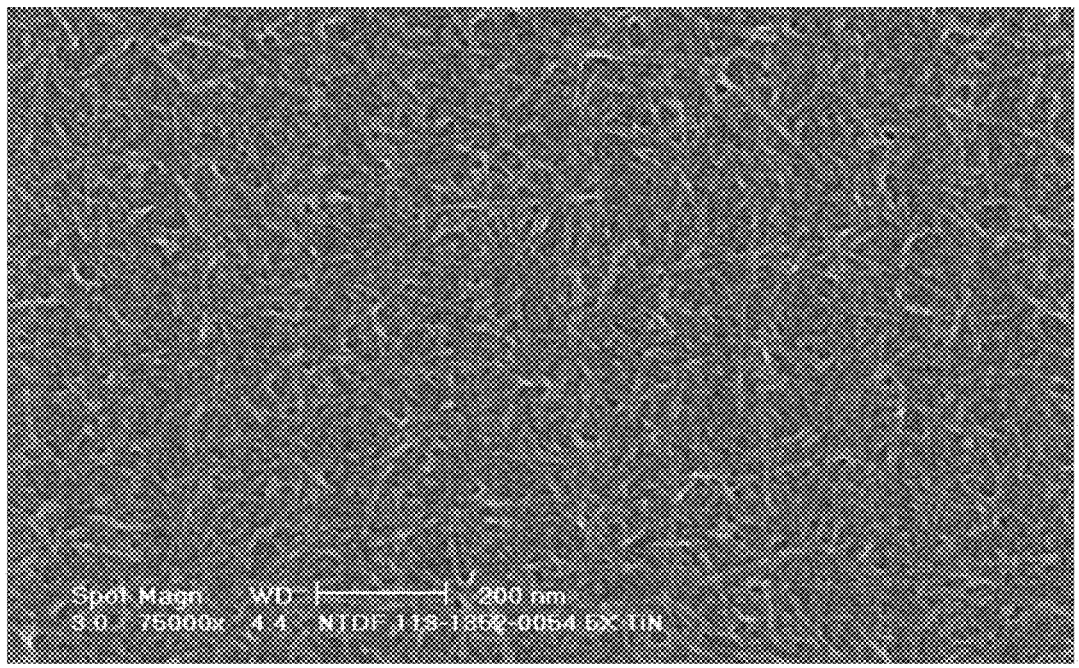
FIGS. 15A and 15B shows SEM images of carbon nanotube films formed by the procedure described in EXAMPLE 1 below with T8 additive.
Figure 15B:
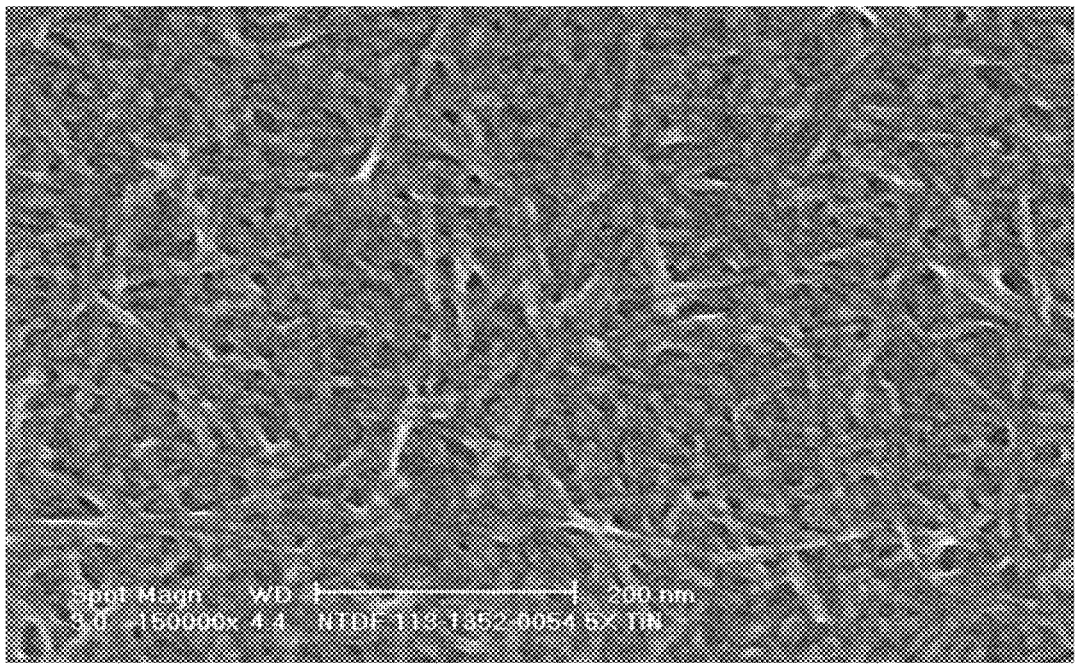

FIGS. 14A and 14B show SEM pictures of carbon nanotube films formed by the above example without any T8 additive. FIGS. 15A and 15B shows SEM images of carbon nanotube films formed by the above example with T8 additive. Estimated silicon added by T8 is 18 ppm and, as shown in FIGS. 15A and 15B, no corresponding colloidal silicon particles are visible.

Example 2

In this example, 16.0-50.0 g of carbon nanotubes, commercially available from Thomas Swan Co. Ltd. (Product name: Elicarb PR0927), are refluxed at a temperature of about 120° C. for about 24 to 30 hours, using 1.6-3.7 L of microelectronics grade 70% nitric acid (15M).

After the nitric acid reflux step, the CNT suspension in acid is diluted in 1-3% nitric acid solution (12.4-14.3 L). The resulting suspension is then filtered through a cross flow filter having a pore size of, for example, 0.1 to 5.0 um and the retentate is collected in 1-3% nitric acid. This process may be repeated for 5-13 times. After the above filtration steps, the retentate is finally collected in DI water. The suspension of CNT in DI water is filtered through the cross flow filter and recovered with DI water and the process repeated several times until the pH of the nanotube:DI water suspension is about 2.5±0.5.

The carbon nanotube suspension is then passed through an ion exchange column to remove any free metal ions, such as $Ca^{2+}$, $Zn^{2+}$, $Na^+$, and $K^+$, that might have been inadvertently picked up during the processing. The ion-exchange procedure is carried out by the following procedure. First, the column is charged with cation exchange resin (ID#: Resin-C-381C) commercially available from Siemens Water. Next, the resin bed is rinsed with DIW in reverse flow for about 10-15 minutes to classify the resin particles by size and remove any resin fines. Then, the resin bed is rinsed with DIW in downward flow to compact the resin. The flow adapters are then adjusted to mechanically compress the resin. The resin bed is rinsed with no less than 26 bed volumes of 10% nitric acid at a flow rate of 7 liters per hour. This may remove any residual sodium off the resin.

Thereafter, the resin bed is rinsed with DIW to remove any residual nitric acid and trace organics generated during the nitric acid treatment. Next, the carbon nanotube feed tank is connected to the system and the carbon nanotube suspension is pumped through the resin bed at a flow rate of 7 liters per hour, thereby removing any free metal ions from the carbon nanotube suspension. The pH of the ion-exchange carbon nanotube:DI water suspension is adjusted up to around 8±0.5 with 29% ammonium hydroxide.

The resulting CNT suspension is then sonicated, thereby turning the CNT suspension in DI water into an optically homogeneous liquid. This liquid is filtered through a cross flow filter having a pore size of, for example, 0.1 to 5.0 um either continuously or in repeated steps until optical density of the permeate is less than 0.5±0.05. Then, the retentate is collected in basic DI water (pH 8.0±0.2). The resulting CNT suspension is sonicated for about 60 minutes in a chilled sonicator bath at a temperature of about 4-5° C. The suspension is then centrifuged about one to three times at about 30,000-100,000 g for about 10-120 minutes at a temperature of about 10-40° C. In one embodiment, the centrifugation process is performed at about 70,000 g-force for 20 minutes at a temperature of about 15° C. The supernatant liquid is transferred to an adequate container through a pump process, thereby avoiding any possible human interference and/or contamination.

Next, the CNT suspension is treated with a mixture of Buffered Oxide Etchant (BOE) and nitric acid. This treatment can be done prior to the centrifuge process described previously or can be done after one or more centrifuge cycles. Carbon nanotube suspension, buffered oxide etchant containing 8-15% HF, 30-35% Ammonium Fluoride and test water, and 70% nitric acid are mixed in a 1:1:1 volume ratio and allowed to soak for 3 to 10 days.

After the pre-determined soaking time, the suspension is filtered over a 5 um dead end teflon filter membrane and washed several times with copious quantities of 3% nitric acid. After the washing step, the CNT filter cake is collected from the filter membrane and dispersed in DIW. The pH is adjusted to around 8.0±0.5 and sonicated for 30-120 minutes to form an optically homogenous liquid. The pH adjustment and sonication steps can be repeated several times until an optically homogenous liquid is obtained. The optical density of the liquid is measured at 550 nm and target optical densities are 40±10. The amount of concentration of the CNT suspension and the amount of DIW used in the final dispersion process can determine the target OD.

After this dispersion process, the CNT suspension can be subjected to another ion-exchange process if required or taken to the final centrifuge process. The centrifugation is done in the same or similar manner as described previously. A final qualification is performed on the resulting carbon nanotube formulation in the liquid phase and on the films generated therefrom. In general, nanotube films are formed by a spin coating process. TABLE 3 summarizes the measurement of trace metal concentrations contained in the resulting carbon nanotube formulation. It is noted that all metal elements are analyzed by ICP-MS/ICP-AES. As shown in TABLE 3, the concentrations of all 13 tested metal elements are less than 1 ppb.

To make a carbon nanotube formulation with the T8 additive, an aqueous solution of T8 is first prepared. T8 commercially available from either Gelest or Plastic Hybrid is dissolved in DI water to a concentration of about 1% by weight. The resulting T8 solution is filtered through a 0.1 um filter cartridge to remove any particulate impurities. The T8 solution can also be ion-exchanged before the filtration step in order to remove any free metal ions. The filtered T8 solution, which may or may not have been ion-exchanged, is added to the carbon nanotube formulation that is obtained by the procedure described above. The amount of T8 solution to be added can be calculated based on the target Si amount in ppm that is required to be added from the T8. The amount of Si in the stock T8 solution can be determined by ICP-AES analysis.

Figure 16A:
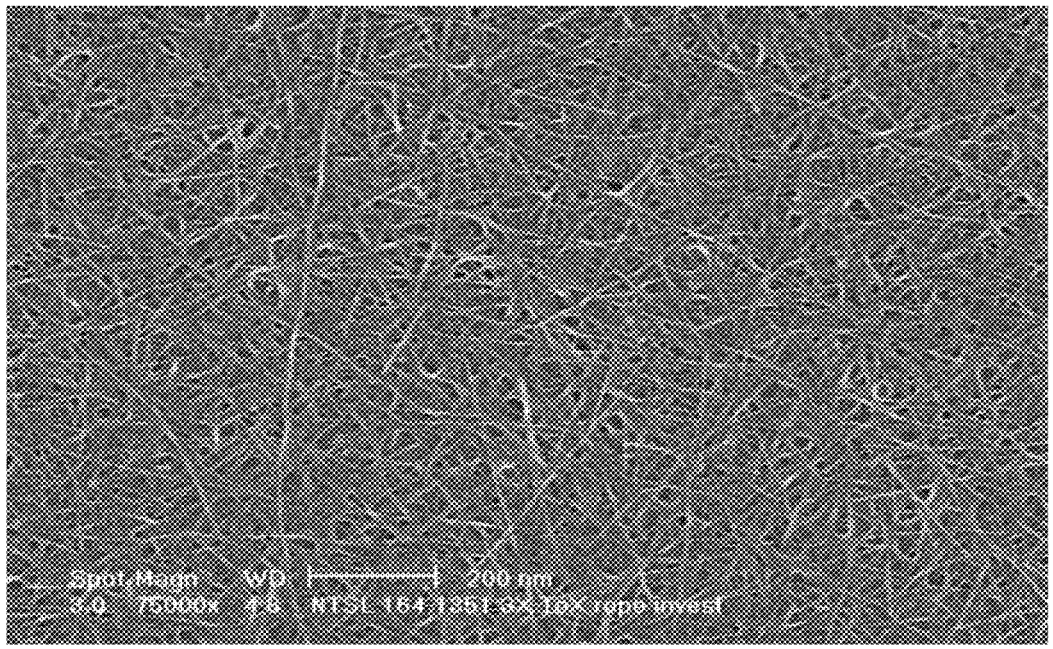
FIGS. 16A and 16B shows SEM images of a CNT fabric formed by spin coating a CNT suspension without being treated with a molecular additive.
Figure 16B:
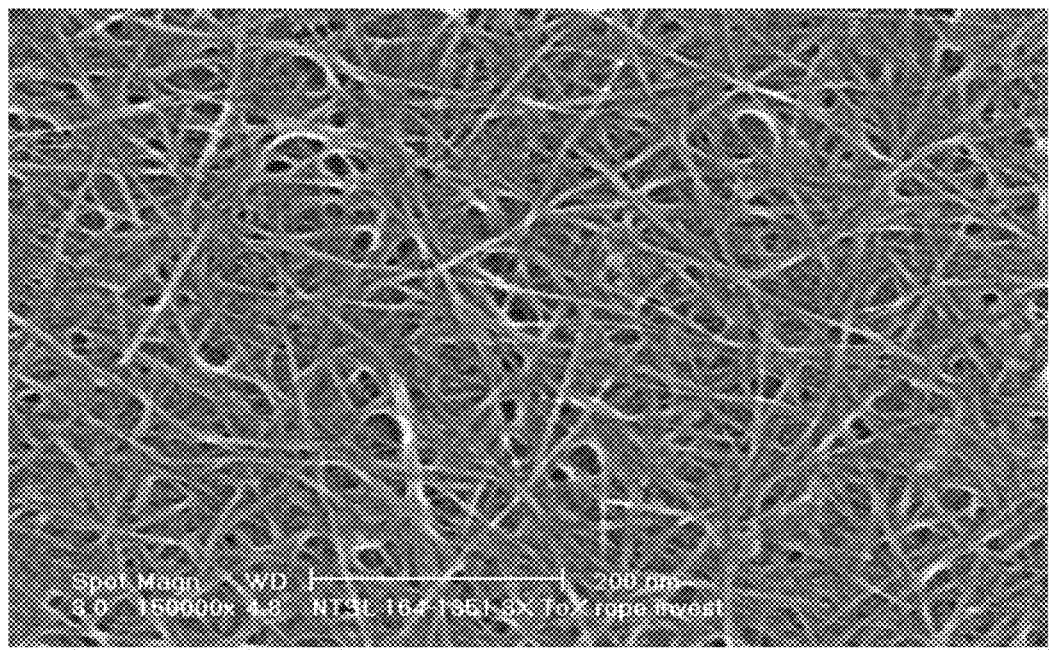
Figure 17A:
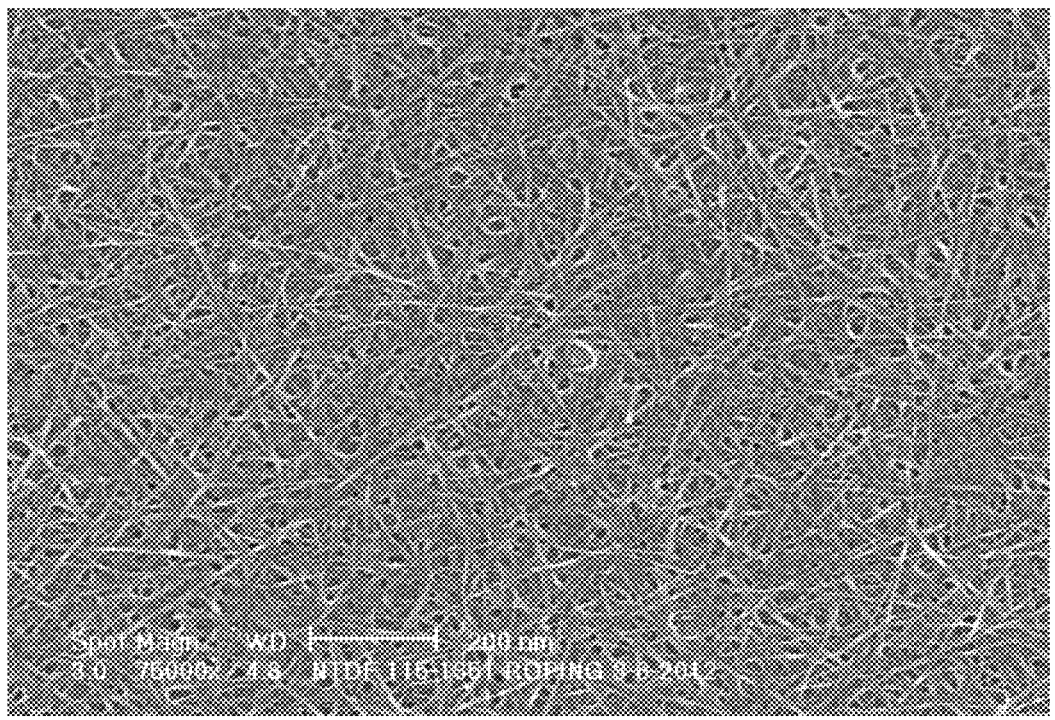
FIGS. 17A and 17B shows SEM images of a CNT fabric formed by spin coating a CNT suspension treated with a molecular additive.
Figure 17B:
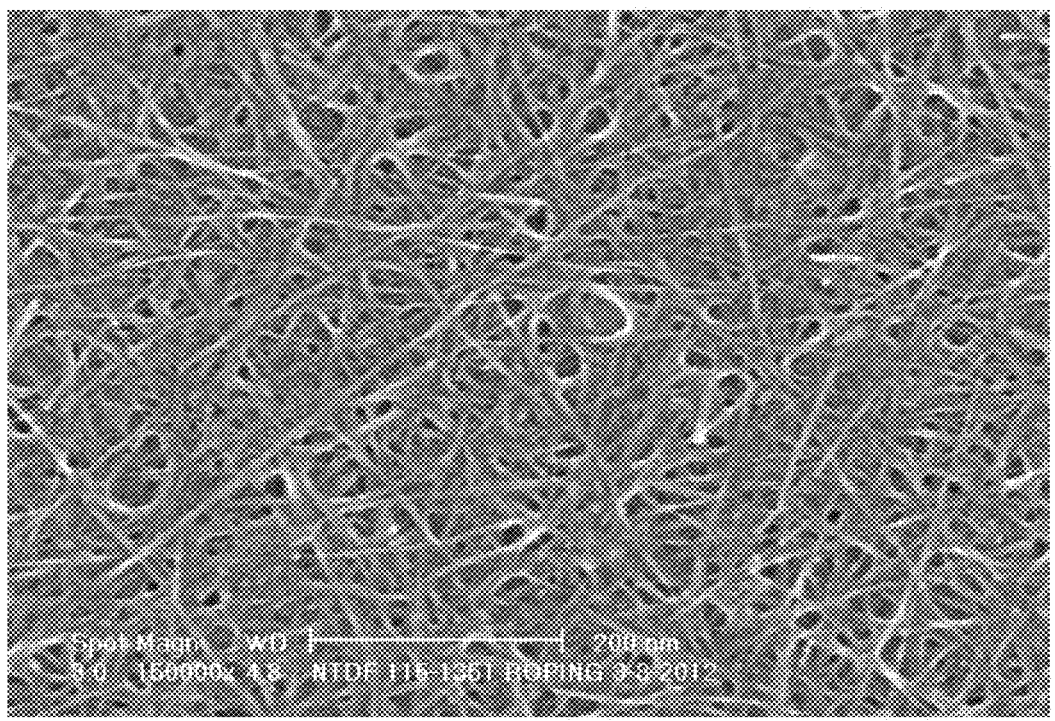

FIGS. 16A and 16B shows SEM pictures of carbon nanotube films formed in the above example without any T8 additive. FIGS. 17A and 17B shows SEM pictures of carbon nanotube films formed in the above example with T8 additive. Estimated silicon added by T8 is 37 ppm and no corresponding colloidal silicon particles are visible.

Example 3

In this example, 16.0-100.0 g of carbon nanotubes (CNTs), commercially available from Thomas Swan Co. Ltd. (Product name: Elicarb PR0927), are refluxed at a temperature of about 120° C. for 24 to 36 hours, using 1.6-3.7 L of microelectronics grade 70% nitric acid (15M).

After the nitric acid reflux step, the CNT suspension in acid is diluted in 1-3% nitric acid solution (8-16 L). The resulting suspension is then sonicated for 0-2 hours and filtered through a cross flow filter having a pore size of, for example, 0.1 to 5.0 um. The filtered slurry is recovered in 1-16 L 1-3% nitric acid. Sonication between filtration steps could range between 0-2 hours in a chilled sonication batch of 4-10° C. This process may be repeated 5-30 times. After the above filtration steps, the retentate is finally collected in DI water. The suspension of CNT in DI water is filtered through the cross flow filter (CFF1) and recovered with DI water. The process may be repeated several times until the pH of the nanotube:DI water suspension is about 3.0±0.5.

The carbon nanotube suspension is then passed through an ion exchange column to remove any free metal ions, such as $Ca^{2+}$, $Zn^{2+}$, $Na^+$, and $K^+$, that might have been inadvertently picked up during the processing. The ion-exchange procedure is carried out by the following procedure. First, the column is charged with cation exchange resin (ID#: Resin-C-381C) commercially available from Siemens Water. Next, the resin bed is rinsed with DIW in reverse flow for 10-15 minutes to classify the resin particles by size and remove any resin fines. Then, the resin bed is rinsed with DIW in downwards flow to compact the resin. The flow adapters are then adjusted to mechanically compress the resin. The resin bed is rinsed with no less than 26 bed volumes of 10% nitric acid at a flow rate of 7 liters per hour. This may remove any residual sodium off the resin.

Thereafter, the resin bed is rinsed with DIW to remove any residual nitric acid and trace organics generated during the nitric acid treatment. Next, the carbon nanotube feed tank is connected to the system and the carbon nanotube suspension is pumped through the resin bed at a flow rate of 7 liters per hour, removing any free metal ions from the carbon nanotube suspension. The carbon Nanotube suspension is allowed to re-circulate through the resin for 0-3 exchanges. The pH of the ion-exchange carbon nanotube:DI water suspension is adjusted up to around 8±0.5 with 29% ammonium hydroxide. The ammonium nitrate concentration of the carbon nanotube solution is also adjusted to between 200-1700 ppm measured as N. The adjusting solution may under go sonication ranging from 0-2 hrs in a chilled sonication bath of 4-10° C. before going into CFF2.

This liquid is filtered through a cross flow filter (CFF2) having a pore size of, for example, 0.1 to 5.0 um either continuously or in repeated steps until optical density of the permeate is less than 0.5-0.05 or has meet specific FOD targets ranging from 45-80% Then, the retentate is collected in basic nitrated DI water (pH~8.0±0.2 and 60+/−20 ppm as N). The resulting CNT suspension is sonicated for 0-60 minutes in a chilled sonicator bath at a temperature of about 4-10° C.

After the CFF2 step, the pH of the CNT suspension is reduced to <1.2 with 3% nitric acid and the preceding steps starting from CFF1 are repeated in nitric acid for 1-3x. The solution is brought back to pH 3.0+/−0.5 as described in the CFF1 procedure. Accordingly, the CFF1, ion-exchange, and CFF2 steps are repeated for several times. After the final CFF2 step, the CNT suspension is subjected to the centrifugation step as described below.

The suspension is centrifuged for about one to three times at about 30,000-100,000 g for about 10-120 minutes at about 10-40° C. In one embodiment, the centrifugation process is performed at about 70,000 g-force for 20 minutes at 15° C. The supernatant liquid is transferred to an adequate container through a pump process, thereby avoiding any possible human intervention or contamination. The suspension may be passed through ion-exchange after the first 1-2 centrifuge passes. Post ion exchange, the suspension will be put back on the centrifuge.

A final qualification is performed on the resulting carbon nanotube formulation in the liquid phase and on the films generated therefrom. Nanotube films are typically formed in a spin coating process. TABLE 8 below summarizes the measurement of trace metal concentrations contained in the resulting carbon nanotube formulation. It is noted that all metal elements are analyzed by ICP-MS/ICP-AES. As shown in TABLE 8, the concentrations of 12 metals are less than 1 ppb, except that the concentration of iron (Fe) is about 1.1-1.4 ppb.

TABLE 8

| Trace Metal | Detection Limit (ppb) | Concentration Ex. 3, Lot 1 (ppb) | Concentration Ex. 3, Lot 2 (ppb) | Concentration Ex. 3, Lot 3 (ppb) |
| --- | --- | --- | --- | --- |
| Al | 1.0 | <1 | <1 | <1 |
| Ca | 1.0 | <1 | <1 | <1 |
| Cr | 1.0 | <1 | <1 | <1 |
| Co | 1.0 | <1 | <1 | <1 |
| Cu | 1.0 | <1 | <1 | <1 |
| Fe | 1.0 | 1.2 | 1.4 | 1.1 |
| Mg | 1.0 | <1 | <1 | <1 |
| Mn | 1.0 | <1 | <1 | <1 |
| Ni | 1.0 | <1 | <1 | <1 |
| K | 1.0 | <1 | <1 | <1 |
| Na | 1.0 | <1 | <1 | <1 |
| Ti | 1.0 | <1 | <1 | <1 |
| Zn | 1.0 | <1 | <1 | 1.0 |

Although embodiments of the present disclosure have been described in detail, it is to be understood that these embodiments are provided for illustrative and explanatory purposes only. Other embodiments may be apparent to those skilled in the art from consideration of this disclosure and practice of the embodiments described herein. Accordingly, it is intended that the true scope of the present disclosure be defined by the appended claims and their equivalents.

What is claimed is:

1. A nanotube solution for forming highly adhesive, low defect nanotube fabrics, comprising:
    a liquid medium;
    a purified dispersion of nanotubes in said liquid medium; and
    a selected concentration of molecular additive in the liquid medium, said molecular additive containing one or more group IV elements;
    a dispersion of molecular silica in said liquid medium;
    wherein said selected concentration of molecular additive is capable of promoting the formation of molecular silica within said nanotube solution while inhibiting the formation of colloidal silica particles;
    wherein said molecular silica is capable of providing an enhanced adhesion property within a nanotube fabric formed from said nanotube solution; and
    wherein said nanotube solution is substantially free of impurities, wherein the impurities consist of polymers and surfactants.

2. The nanotube solution of claim 1, wherein said molecular additive comprises a soluble form of an oxygen containing compound of said one or more group IV elements.

3. The nanotube solution of claim 1, wherein said molecular additive comprises a soluble form of a silicon oxide compound.

4. The nanotube solution of claim 1, wherein said molecular additive comprises a water soluble silsesquioxane cage molecule.

5. The nanotube solution of claim 1, wherein said dispersion of molecular silica is less than 60 ppm.

6. The nanotube solution of claim 1, wherein said liquid medium is an aqueous solvent, or alternatively a non-aqueous solvent, or alternatively their mixtures.

7. The nanotube solution of claim 1, wherein said nanotubes are carbon nanotubes, and said carbon nanotubes are one of single-wall carbon nanotubes, multi-wall carbon nanotubes having two or more concentric tubes, and any mixtures thereof.

8. The method of claim 7, wherein said carbon nanotubes are functionalized carbon nanotubes.

9. A method for forming a nanotube film having an enhanced adhesion property, comprising:
depositing a nanotube layer on a substrate, using the nanotube solution of claim 1.

10. The method of claim 9, further comprising baking the substrate in air at a temperature ranging from about 100° C. to about 300° C.

11. The nanotube solution of claim 1 wherein said molecular additive comprises one of $SiO_2$, $SiCl_4$, and $H_2SiCl_2$.

12. The nanotube solution of claim 1 wherein said molecular additive comprises $Si(O\text{-}Et)_4$.

13. The nanotube solution of claim 1 wherein said nanotube solution has a concentration of trace metals of less than 1.5 parts per billion (ppb).

14. A nanotube solution for forming highly adhesive, low defect nanotube fabrics, comprising:
a purified dispersion of nanotubes in a liquid medium; and
a selected concentration of a molecular additive in said liquid medium, wherein said molecular additive includes molecules that provide source elements for forming a group IV oxide within said nanotube solution;
a dispersion of a molecular scale group IV oxide particles in said liquid medium;
wherein said selected concentration of molecular additive is capable of promoting the formation of molecular scale group IV oxide particles within said nanotube solution while inhibiting the formation of colloidal scale particles;
wherein said molecular scale group IV oxide particles are capable of providing an enhanced adhesion property within a nanotube fabric formed from said nanotube solution;
wherein said nanotube solution is substantially free of impurities, wherein the impurities consist of polymers and surfactants.

15. The nanotube solution of claim 14, wherein said group IV oxide includes one of silicon oxide, germanium oxide, and a combination thereof.

16. The nanotube solution of claim 14, wherein said molecular additive introduces a group IV element in said liquid medium, the group IV element being one selected from the group consisting of Si, Ge, Sn, and Pb.

17. The nanotube solution of claim 14, wherein said desired group IV oxide concentration is predetermined such that molecular scale nanoparticulates of less than 3 nm are prevented from coalescing and that no larger aggregate particulates are visible in a nanotube film formed from the nanotube solution, using scanning electron or optical microscopes.

18. The nanotube solution of claim 14, wherein said molecular additive comprises a germanium containing molecule for forming germanium oxides within the nanotube solution.

19. The nanotube solution of claim 18, wherein the molecular additive introduces germanium in the liquid medium.

20. The nanotube solution of claim 18, wherein the germanium containing molecule comprises one or more of $GeO_2$ hydrate, $GeCl_4$, germanium tetrachloride, germylsesquioxane, and germanium tetra-ethoxide.

21. The nanotube solution of claim 14, wherein the molecular additives comprise a mixture of a silicon source and a germanium source in a predetermined proportion.

22. The nanotube solution of claim 14 wherein said nanotube solution has a concentration of trace metals of less than 1.5 parts per billion (ppb).

* * * * *